United States Patent
Furukawa et al.

(10) Patent No.: US 6,184,041 B1
(45) Date of Patent: Feb. 6, 2001

(54) FUSED HYBRID RESIST SHAPES AS A MEANS OF MODULATING HYBRID RESIST SPACE WIDTH

(75) Inventors: Toshiharu Furukawa, Essex Junction; Mark C. Hakey; Steven J. Holmes, both of Milton; David V. Horak, Essex Junction; Paul A. Rabidoux, Winooski, all of VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/078,118

(22) Filed: May 13, 1998

(51) Int. Cl.$^7$ ........................................................ G03F 7/20
(52) U.S. Cl. ........................ 436/396; 430/5; 430/312; 430/313; 430/323
(58) Field of Search ............................ 430/5, 312, 313, 430/323, 396

(56) References Cited

U.S. PATENT DOCUMENTS

| | | | |
|---|---|---|---|
| 4,405,708 | 9/1983 | van Pelt et al. | 430/281 |
| 4,568,631 | 2/1986 | Badami et al. | 430/315 |
| 4,687,730 | 8/1987 | Eron | 430/324 |
| 4,707,218 | 11/1987 | Giammarco et al. | 156/643 |
| 5,330,879 | 7/1994 | Dennison | 430/313 |
| 5,362,584 | * 11/1994 | Brock et al. | 430/5 |
| 5,776,660 | * 7/1998 | Hakey et al. | 430/296 |
| 5,827,625 | * 10/1998 | Lucas et al. | 430/5 |
| 5,840,447 | * 11/1998 | Peng | 430/5 |
| 5,881,125 | * 3/1999 | Dao | 378/35 |
| 6,007,968 | * 12/1999 | Furukawa | 430/314 |
| 6,096,618 | * 8/2000 | Dunn | 438/328 |

* cited by examiner

Primary Examiner—Mark F. Huff
Assistant Examiner—Nicole Barreca
(74) Attorney, Agent, or Firm—Schmeiser, Olsen & Watts; James M. Leas

(57) ABSTRACT

The preferred embodiment of the present invention overcomes the limitations of the prior art and provides a method to form spaces in hybrid resist with varying widths. In particular, the preferred method facilitates the formation of spaces with different widths by using mask shapes (either openings or lines) that are smaller than the diffraction limit of the photolithography tool. Diffraction effects at these dimensions reduce the light intensity reaching the resist surface such that the hybrid resist receives an intermediate exposure. These portions of hybrid resist that receive an intermediate exposure are soluble in developer and thus develop away to form spaces in the hybrid resist. Thus, spaces in the hybrid resist of varying widths can be formed.

21 Claims, 28 Drawing Sheets

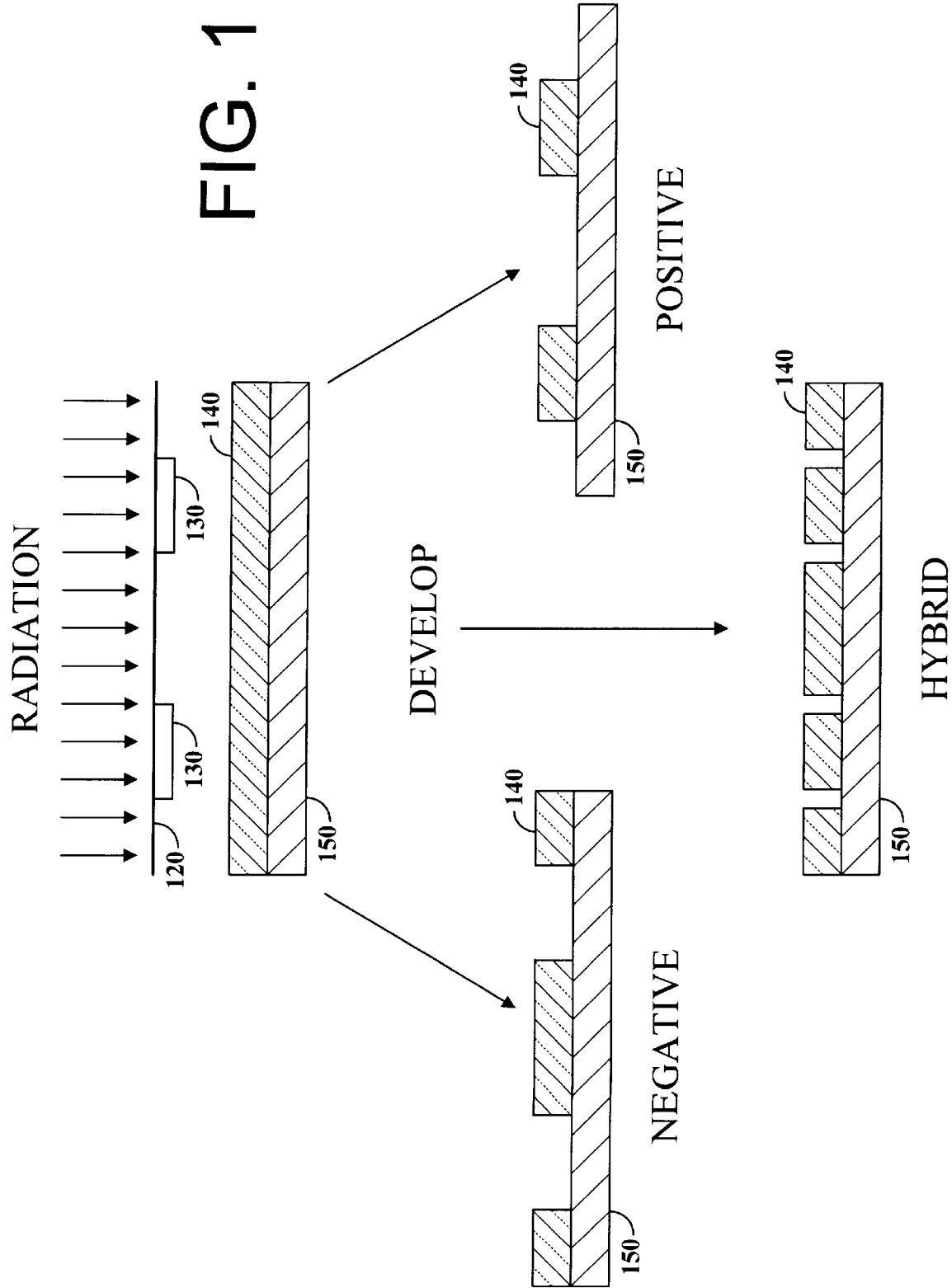

FUSED HYBRID RESIST SHAPES AS A MEANS OF MODULATING HYBRID RESIST SPACE WIDTH

RELATED APPLICATIONS

This application is related to patent applications "Low 'K' Factor Hybrid Photoresist," Ser. No. 08/715,288, Docket No. FI9-96-055; and "Frequency Doubling Photoresist," Ser. No. 08/715,287, Docket No. BU9-96-047, both filed Sep. 16, 1996.

BACKGROUND OF THE INVENTION

1. Technical Field

The present invention relates generally to the field of semiconductor manufacturing and, more specifically, to a method for forming features in semiconductor manufacturing.

2. Background Art

Today, our society is heavily dependent on high-tech electronic devices for everyday activity. Integrated circuits are the components that give life to our electronic devices. Integrated circuits are found in widespread use throughout our country, in appliances, in televisions and personal computers, and even in automobiles. Additionally, modern manufacturing and production facilities are becoming increasingly dependent on the use of machines controlled by integrated circuits for operational and production efficiencies. Indeed, in many ways, our everyday life could not function as it does without integrated circuits. These integrated circuits are manufactured in huge quantities in our country and abroad. Improved integrated circuit manufacturing processes have led to drastic price reductions and performance enhancements for these devices.

The traditional integrated circuit fabrication process is a series of steps by which a geometric pattern or set of geometric patterns are transformed into an operational integrated circuit. An integrated circuit consists of superimposed layers of conducting, insulating, and device-forming materials. By arranging predetermined geometric shapes in each of these layers, an integrated circuit that performs the desired function may be constructed. The overall fabrication process consists of the patterning of a particular sequence of successive layers. The patterning process used to fabricate integrated circuits is typically performed using lithography followed by a variety of subtractive (etch) and additive (deposition) processes.

Photolithography, a type of lithographic process, is used in the manufacturing of semiconductor devices, integrated optics, and photomasks. The process typically involves the following steps: applying a layer of a material (known as a photoresist, or resist) that will react when exposed to actinic or activating energy; exposing portions of the photoresist to actinic energy such as light or other ionizing radiation, i.e., ultraviolet, electron beams, X-rays, etc., thereby changing the solubility of portions of the resist; and developing the resist by washing it with a basic developer solution, thereby removing the non-irradiated (in a negative resist) or irradiated (in a positive resist) portions of the layer.

As the need for higher and higher levels of integration has arisen in the industry, the need for a larger number of patterns, lines, and spaces in a given area has increased dramatically. In response, the scaling of lithographic features has been an essential aspect of enhancing the performance and density of semiconductor devices.

Previously, a hybrid resist was disclosed which possessed both a negative tone and a positive tone response as explained in the related applications listed above. Spaces can be formed in hybrid resist that are smaller than can be formed in normal resist. For example, 0.15 µm spaces can be formed in hybrid resist using lithography tools that are normally limited to 0.30 µm resolution. This is possible because hybrid resist, when exposed and developed, forms a space in the region that corresponds to the transition from light to dark at the edge of an aerial image. That is, the portion of the resist exposed to some predetermined range of radiation intensity less than full intensity but more than zero intensity will develop away to become a space.

The size of the space is dependent upon several factors. In particular, the size of the space is a function of the sharpness of the exposure profile and the resist chemistry. Because the space width formed in hybrid resist is a function of the exposure profile, the width of spaces can be tightly controlled. In particular, the space width is generally unchanging as the exposure dose and the reticle image size are changed, allowing for very precise image control for a set space width within each chip.

Unfortunately, the same features that allow hybrid resist to be used to print space widths with precise control limits the ability to create spaces with different widths. In particular, as mentioned above, the exposure profile and hence the space width is generally a function of the numerical aperture (NA) of the lithography tool. Generally, it is impractical to change the NA of a lithography tool between fabrication steps. Because the NA cannot be changed, it is not possible using current methods to form hybrid spaces with different widths. Instead, once the NA and hybrid resist chemistry is selected, the space width is set and varied space widths cannot be easily produced in the same resist layer.

Thus, it would be an improvement in fabrication technology to provide a method for forming spaces in the resist with widths different than the hybrid resist space.

DISCLOSURE OF INVENTION

Accordingly, the present invention provides a photoresist material having, simultaneously, both a positive tone and a negative tone response to exposure. This combination of materials can provide a new type of resist, which we call a hybrid resist.

Additionally, the present invention provides a method for forming spaces in the hybrid resist with varying widths. In particular, the preferred method facilitates the formation of spaces with different widths by using mask shapes (either openings or lines) that are smaller than the diffraction limit of the photolithography tool. Diffraction effects at these dimensions reduce the light intensity reaching the resist surface such that the hybrid resist receives an intermediate exposure. These portions of hybrid resist that receive an intermediate exposure are soluble in developer and thus develop away to form spaces in the hybrid resist. Thus, spaces in the hybrid resist of varying widths can be formed.

The present invention can be used in a wide variety of applications. In particular, the preferred embodiment can be applied to form contact pads for fabricated field-effect transistors. This method would also be useful for building wiring structures in support circuits for memory or logic applications and for fabricating some types of memory structures.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and FIG. 1 is a schematic diagram showing the use of the hybrid resist;

BEST MODE FOR CARRYING OUT THE INVENTION

Figure 3:
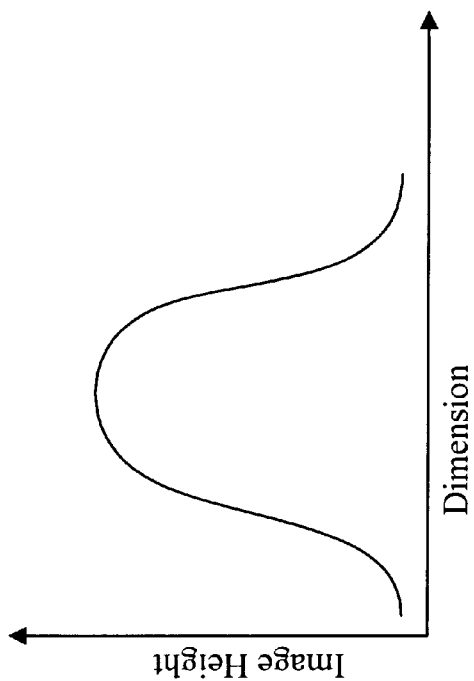
FIG. 3 is a graph illustrating the line pattern for positive resist printed with a reticle line pattern.

The preferred embodiment of the present invention overcomes the limitations of the prior art and provides a method to form spaces in hybrid resist with varying widths. In particular, the preferred method facilitates the formation of spaces with different widths by using mask shapes (either openings or lines) that are smaller than the diffraction limit of the photolithography tool. Diffraction effects at these dimensions reduce the light intensity reaching the resist surface such that the hybrid resist receives an intermediate exposure. These portions of hybrid resist that receive an intermediate exposure are soluble in developer and thus develop away to form spaces in the hybrid resist. Thus, spaces in the hybrid resist of varying widths can be formed. A description of hybrid resist will now be given, followed by a description of the preferred embodiments.

Hybrid Photoresist

The preferred embodiment uses photoresist material having, simultaneously, both a positive tone and a negative tone response to exposure. This combination of materials can provide a new type of resist, which we call a hybrid resist.

As a hybrid resist is exposed with actinic radiation, areas exposed with high intensity radiation form a negative tone line pattern. Areas which are unexposed remain insoluble in developer, thus forming a positive tone line pattern. Areas which are exposed with intermediate amounts of intensity, such as the edges of the aerial image where diffraction effects have reduced the intensity, form a space in the resist film during develop. This resist response is an expression of the unique dissolution rate properties of this resist, in which unexposed resist does not develop, partially exposed resist develops at a high rate, and highly exposed resist does not develop.

The unique dissolution rate response of the hybrid photoresist allows a single aerial image to be printed as a space/line/space combination rather than as a single line or space, as with conventional resist. This 'frequency doubling' capability of this resist allows conventional expose systems to be extended to higher pattern densities. It is an advantage of one example of hybrid resist that lines and spaces of 0.15 $\mu$m and less can be printed with current deep ultra violet (DUV) lithography tools that are designed for operation at 0.30 $\mu$m resolution.

It is a further advantage of this type of hybrid resist that the space width is generally unchanging as the exposure dose and the reticle image size are changed. This allows very precise image control for the space width within each chip, across each wafer, and from one batch of product wafers to the next.

Still another advantage of the hybrid resist is the relaxation of the minimum reticle feature size due to the frequency doubling capability of hybrid resist. For example, to print a 0.2 μm feature with conventional resist generally requires a 0.2 μm reticle image size. With hybrid resist, a 0.2 μm space can be formed with a single edge of a reticle feature; for example, a 0.5 μm reticle opening could produce two 0.2 μm spaces and a 0.2 μm line. In this way, one could accomplish 'reduction' x-ray or E-beam lithography; the reticle image pitch could be approximately 2× the printed pitch on the substrate. This also has the additional advantage of allowing a relaxation of the image size requirements of optical reticles, reducing cost and improving yield of the reticle. It is an advantage of hybrid resist that lines and spaces of 0.2 μm and less may be achieved without altering the present tools.

It is a further advantage that the space width is generally unchanging as the exposure dose and reticle sizes change, thereby allowing greater process latitude for control of space width. Through the use of the hybrid resist of the present invention, errors in the image dimension on the reticle are not reproduced in the space width printed on the substrate. As a result, the across-chip space width variation is minimized. This is valuable for optical, X-ray and e-beam exposure methods. It is especially useful in lithographic techniques that require a 1× reticle, i.e., a reticle that normally has a one-to-one relationship with the image printed on the substrate, because variations in the image size on the reticle are normally reproduced on the substrate.

Figure 2:
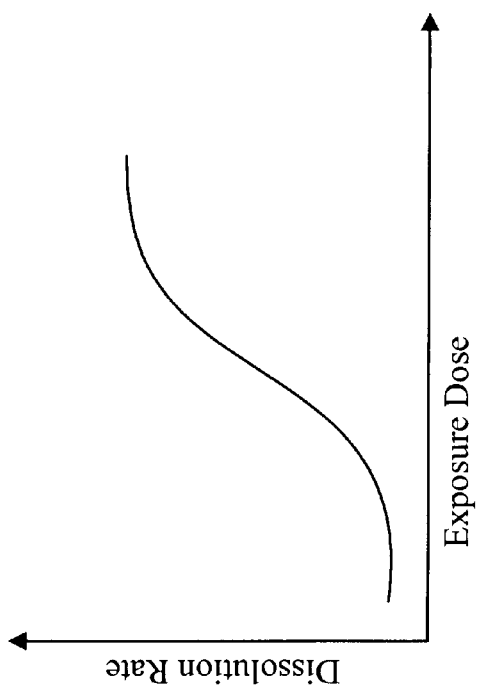
FIG. 2 is a graph is illustrating how positive resist undergoes an increase in solubility as the exposure dose is increased.

Accordingly, the preferred embodiment hybrid resist provides a photoresist material having, simultaneously, both a positive tone and a negative tone response to exposure. The positive tone response dominates at the lower exposure dose while the negative response predominates at the higher exposure dosages. Exposure of this resist creates a space/line/space combination, whereas either of the conventional resists would produce only a single feature. Turning to FIG. 2, a graph is illustrated showing how positive resist undergoes an increase in solubility as the exposure dose is increased. Turning to FIG. 3, the line pattern for positive resist printed with a reticle line pattern is illustrated.

Figure 5:
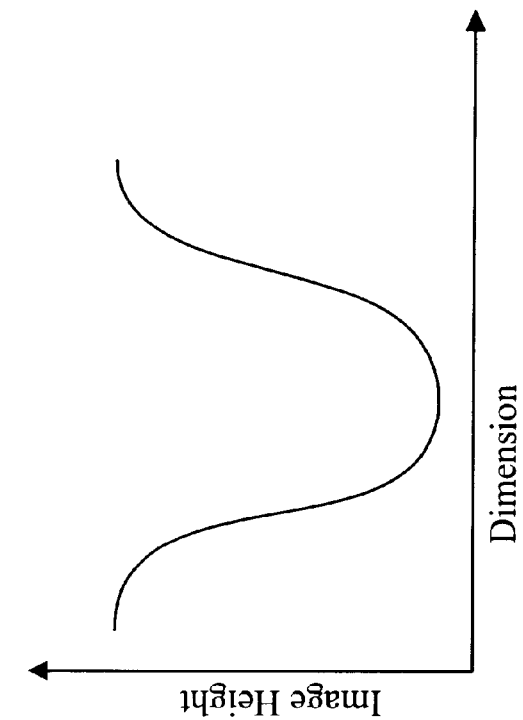
FIG. 5 is a graph illustrating the line pattern for negative resist printed with a reticle line pattern.
Figure 4:
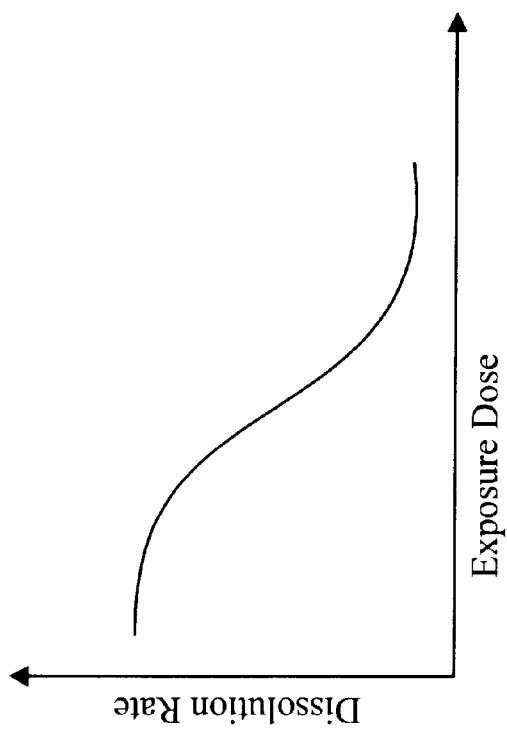
FIG. 4 is a graph illustrating how in negative resist systems exposed areas undergo a reduction in solubility as the exposure dose is increased.

On the other hand, in the negative resist system exposed areas undergo a reduction in solubility as the exposure dose is increased, as illustrated in FIG. 4. Turning to FIG. 5, the line pattern for negative resist printed with a reticle line pattern is illustrated.

Figure 7:
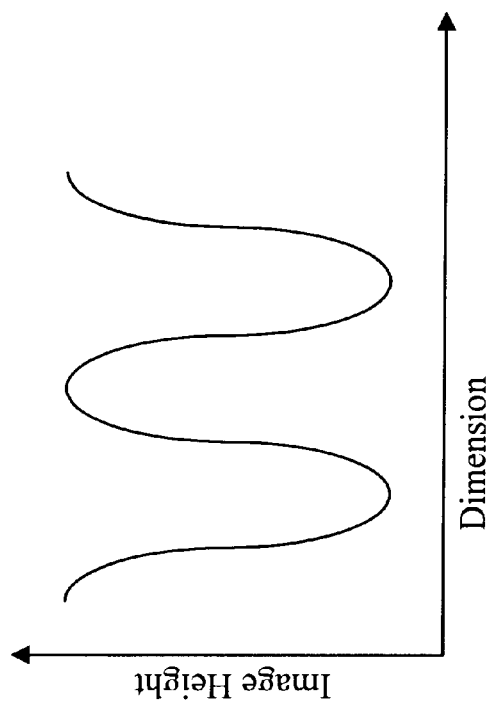
FIG. 7 is a graph illustrating the space/line/space pattern formed onto a substrate using hybrid resist.
Figure 6:
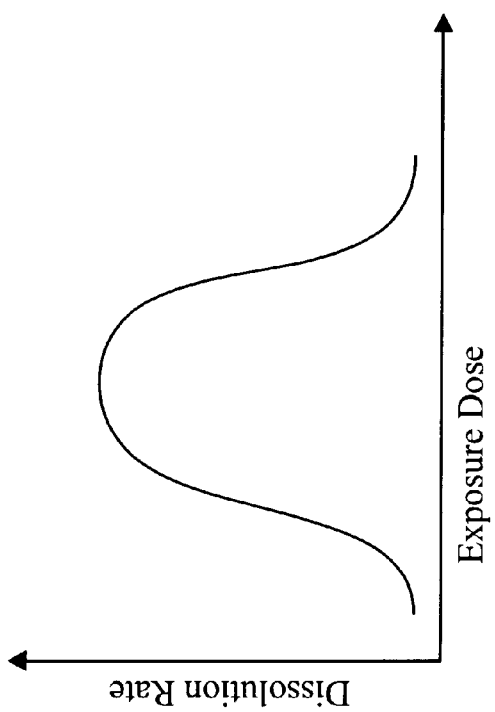
FIG. 6 is a graph of the resist solubility as a function of exposure dose for hybrid resist.

For the hybrid resist of the present invention, the positive tone response causes an increase in solubility in the areas where diffraction effects have reduced the expose intensity, such as the areas near the edge of the reticle image. As the exposure dose is increased, the negative tone response predominates, causing a reduction in solubility in the more highly exposed areas. Turning to FIG. 6, the graph of the resist solubility as a function of exposure dose for hybrid resist is illustrated. Printing a reticle line pattern onto a substrate results in the space/line/space pattern illustrated in FIG. 7.

In this manner, the aerial image is "frequency doubled" to produce twice the number of features than would otherwise be attainable with the standard resist. FIG. 1 illustrates these salient differences between a positive resist, a negative resist, and a hybrid resist. In FIG. 1, a hybrid photoresist 140 has been deposited over the surface of substrate 150. A mask 120 with chrome areas 130 is used to selectively mask portions of photoresist 140 from a radiation source. After exposure, photoresist 140 is developed and portions subsequently removed by washing the surface of the wafer. Depending on the nature and composition of photoresist 140, a certain pattern, which is related to chrome areas 130 on mask 120, will be formed in photoresist 140. As shown in FIG. 1, a positive photoresist will leave areas that correspond to chrome areas 130. A negative photoresist will create a pattern whereby the areas that correspond to chrome areas 130 are removed from substrate 150. A hybrid photoresist material will leave a photoresist pattern that corresponds to removal of the photoresist material from the areas of substrate 150 that are associated with the edges of chrome areas 130.

The frequency doubling hybrid resist is typically formulated using components of existing positive and negative tone resists. This includes, for example, poly (hydroxystyrene) resins which are partially modified with acid-sensitive solubility dissolution inhibiting functionalities, a cross-linker, a photo-acid generator, and, optionally, a base additive and a photosensitizer.

The resist formulations may be varied to obtain a fast positive tone reaction and a slow negative tone reaction for optimal results. Additionally, the positive tone component can be chosen such that it is relatively insensitive to post expose bake temperatures, while the negative tone portion is chosen to be more highly sensitive to post expose bake temperatures. In this way, the relative sensitivity of the positive and negative responses can be altered with bake temperatures to provide the desired imaging results.

Figure 10:
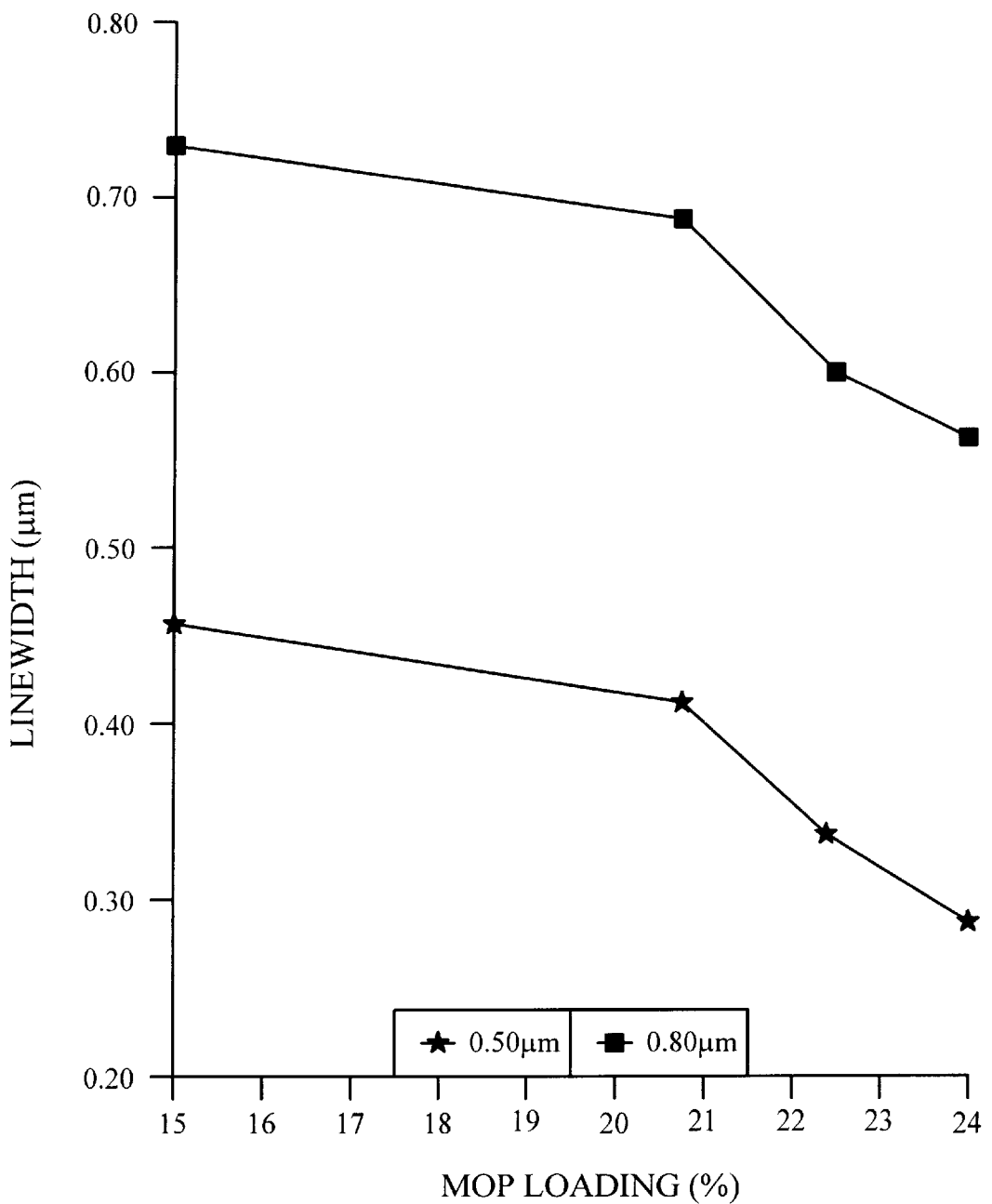
FIG. 10 is a graph showing the linewidth in nm plotted against the amount of positive tone solubility inhibitor (MOP) incorporated in a hybrid resist of the present invention.
Figure 15:
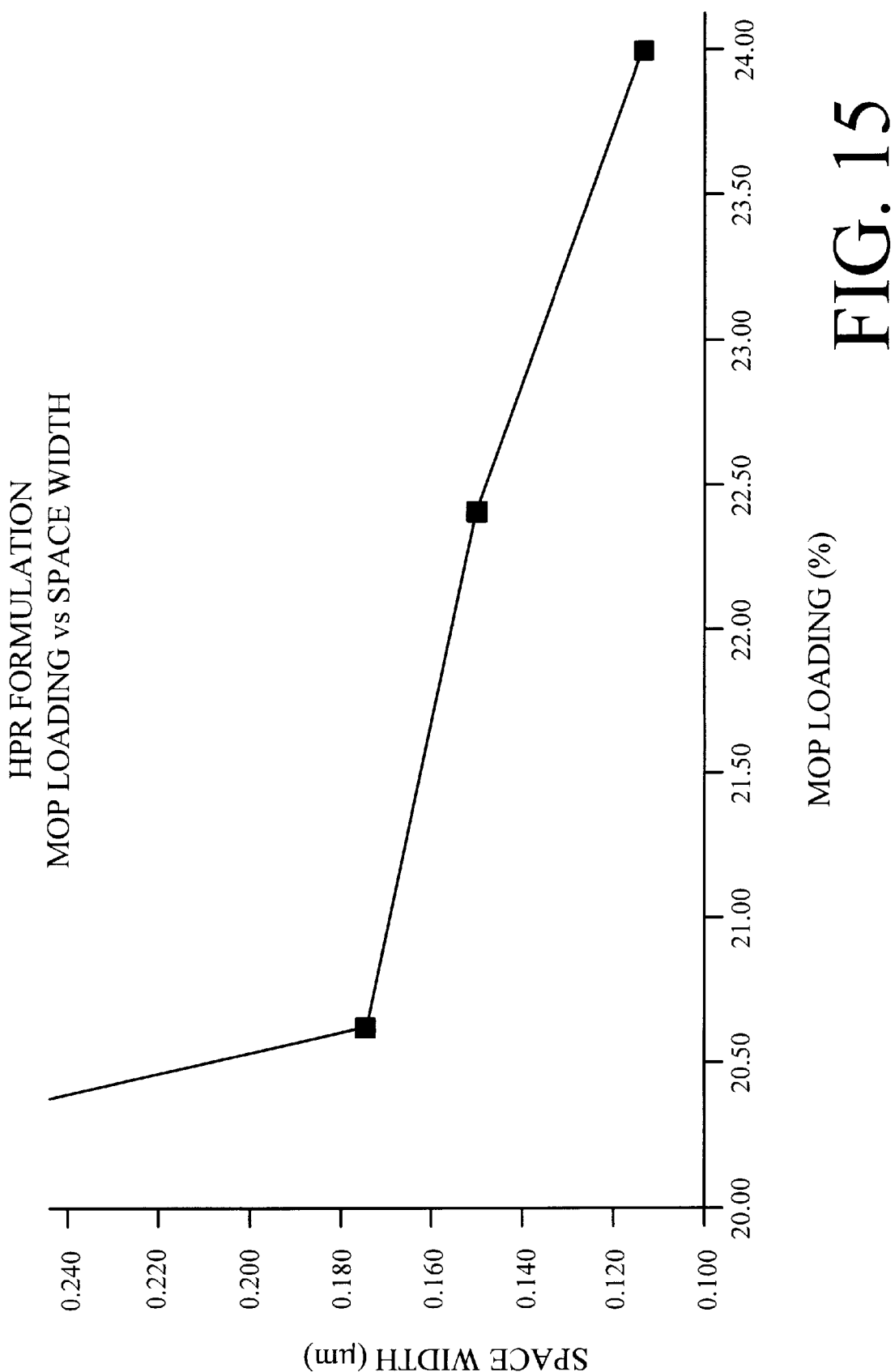
FIG. 15 is a graph showing the variation in space width in $\mu$m as a function of MOP loading using one formulation of hybrid resist of the present invention.

In addition, the resist formulations may be altered to provide space widths of different dimensions. For example, as the amount of solubility inhibitor on the poly (hydroxystyrene) resin is increased, the printed space width becomes smaller (FIG. 15). This approach may also be used to alter the isofocal print bias of the negative tone line; at higher positive tone solubility inhibitor concentrations, the isofocal print bias of the negative tone line increases (FIG. 10). This is desirable in some applications for reducing the size of the printed negative tone line, optimizing the frequency doubling characteristics of the resist.

The relative responses of the positive and negative tone functions of the hybrid resist can also be altered by modifying the exposure conditions. For example, the negative tone line of the hybrid resist does vary with exposure dose and reticle dimension, similar to the behavior of a conventional resist. Thus, as exposure dose is increased, for example, the negative tone line increases in width, and the spaces remain the same size, but the spaces are shifted to a new position on the substrate, since they lie adjacent to the negative line. Similarly, the positive tone lines alter in size as the exposure dose or reticle dimension are altered.

As another example, two reticles could be used to print two separate patterns in the resist. One reticle could be exposed with a high dose, causing the hybrid functions to be expressed in the resist. Another reticle could be exposed in the same resist film at a lower dose, causing only the positive tone function to be expressed in that portion of the resist. This effect could also be accomplished with a single expose process if, for example, the reticle contained a partial filter of the actinic radiation in the areas where a lower exposure dose was desired. This allows wider spaces to be printed at the same time as the narrower features, which is necessary in some device applications.

In a modification of this two-step imaging approach, a hybrid resist can be used to create a standard negative tone pattern. If the resist film is image-wise exposed with a standard negative tone reticle, baked to form the hybrid image, then blanket exposed with actinic radiation and developed without a second post-expose bake process, the result is a standard negative tone image. This approach may be desirable in some applications, such as the formation of gate conductor circuits, which require very small lines to be printed, but do not require a high density image pitch. As an alternative to this method, the resist may be blanket exposed to a low dose of actinic energy after the image-wise exposure and before the baking step. The desirability of the method would depend on whether a solubility inhibiting protective group is present on the resin and whether the positive tone response is temperature dependent.

Figure 8:
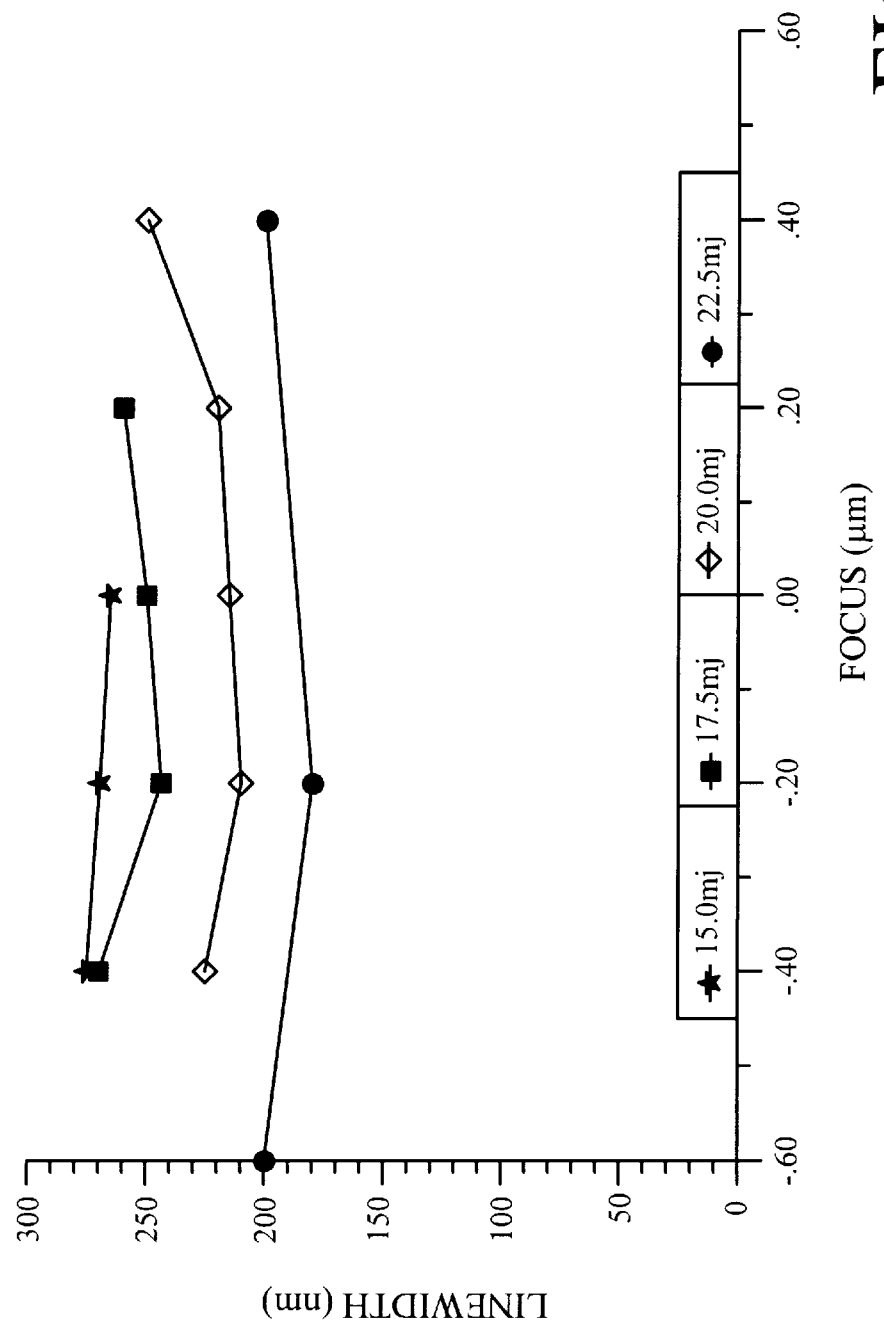
FIG. 8 is a graph of linewidth in nanometers (nm) plotted against focus in microns ($\mu$m) of a formulation of a standard negative resist at various exposure energies.
Figure 9:
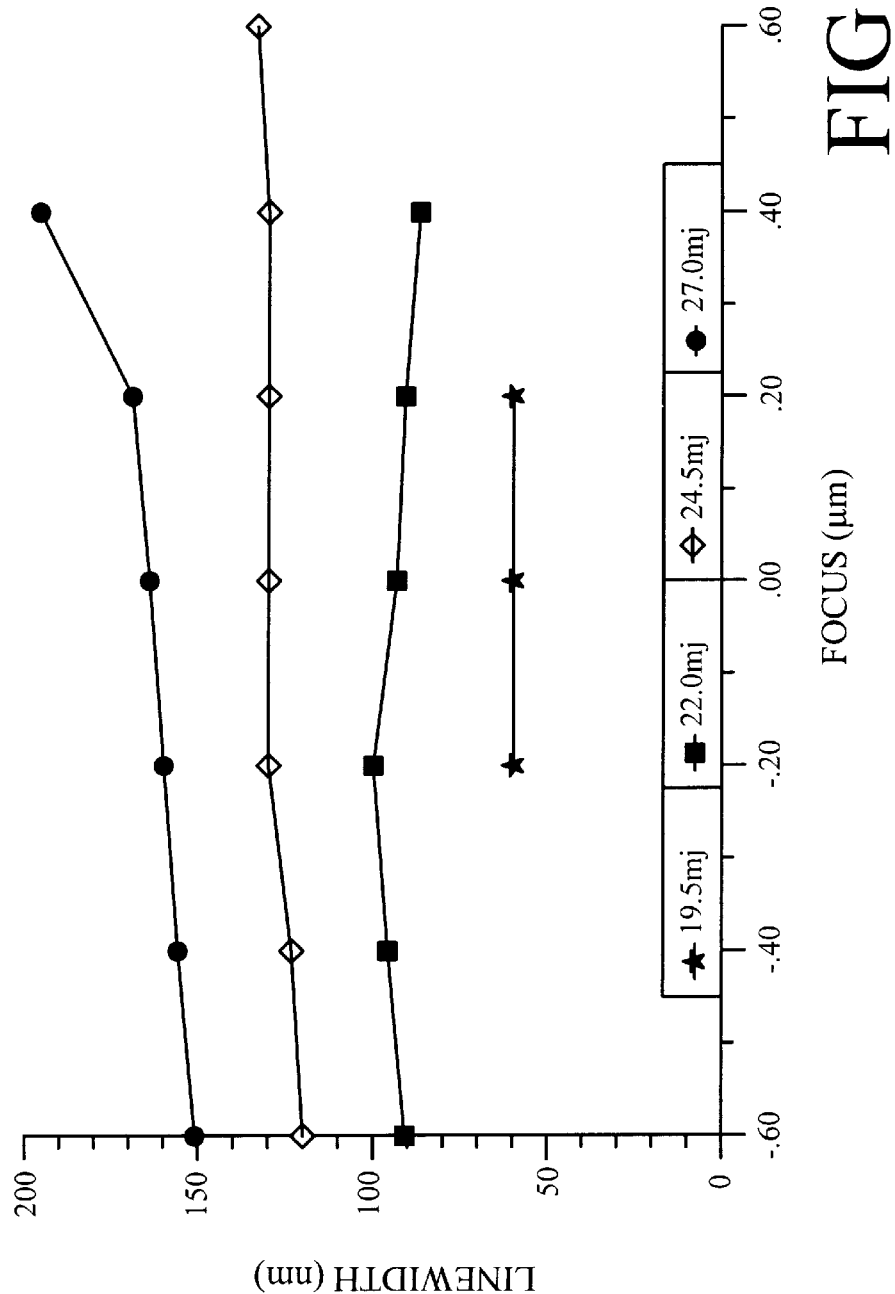
FIG. 9 is a graph of linewidth for a negative tone line of a hybrid pattern in nm plotted against focus in $\mu$m of a hybrid resist of the present invention at various exposure energies.

An advantage of using the hybrid resist in such applications is that the negative tone line of the hybrid resist can exhibit a large print bias at its isofocal point, as shown in FIG. 9. In other words, at the point of largest process latitude for the hybrid negative tone line, the resist image size can be substantially smaller than the reticle image size. This is desirable because the aerial image is less degraded by diffraction effects at the larger reticle size, thus allowing a larger depth of focus to be attained than is possible with conventional positive and negative tone systems, as shown in FIG. 8. This print bias is a result of the fact that the edge of the chrome line prints as a space. The space, in effect, acts to 'trim' the edges of the aerial image, causing the negative line to print smaller than it would with a conventional negative resist. This is an expression of the frequency doubling character of a hybrid resist.

It is possible to design the resist formulation to optimize the print bias of the negative tone line. For example, by choosing an appropriate loading factor for the positive tone solubility inhibitor, one may obtain a particular print bias as shown in FIG. 10. In theory, it is quite obvious that similar variations in the photoresist response can also be brought about by making appropriate changes in concentrations and reactivities of other components as well.

Figure 11:
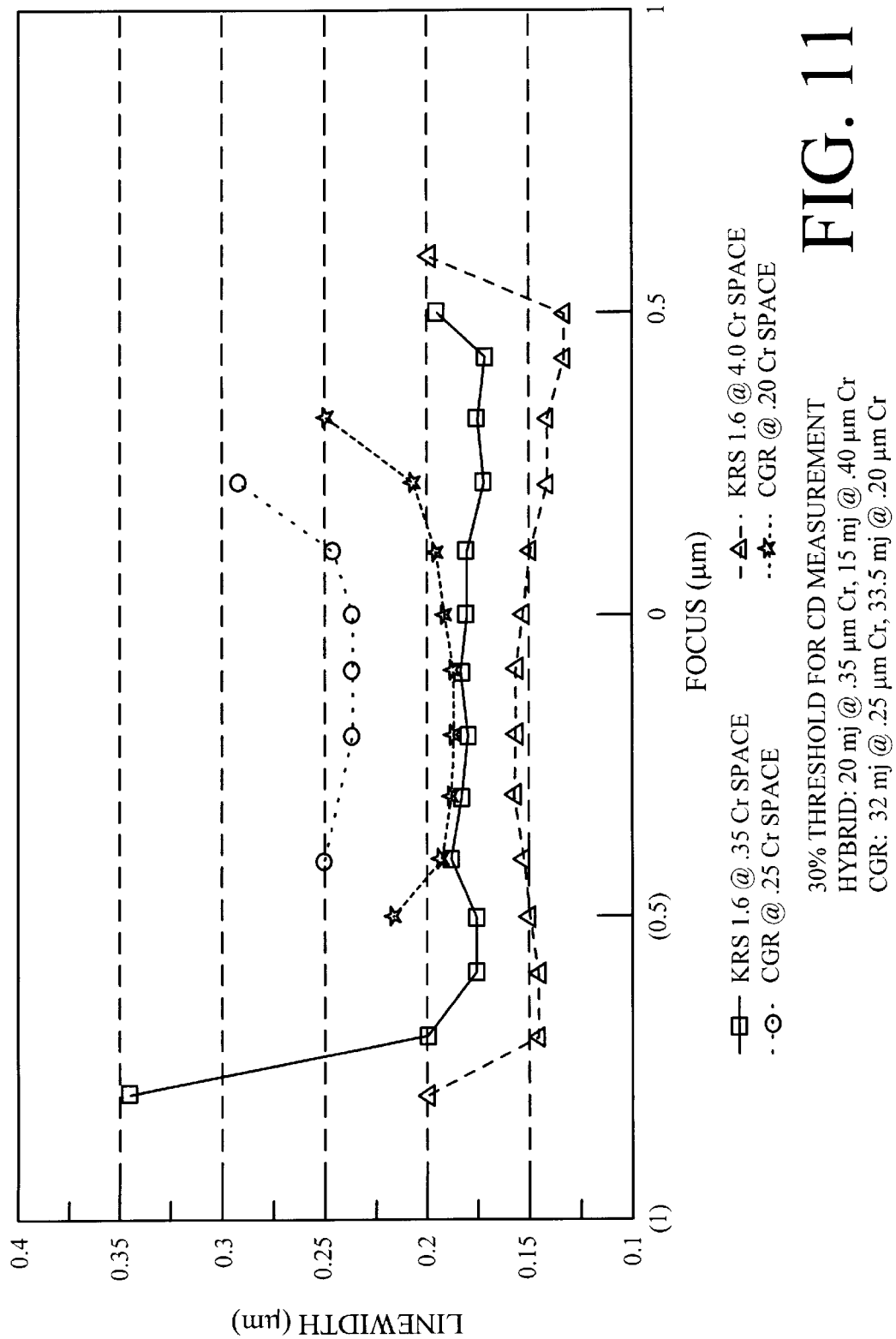
FIG. 11 is a comparative model of what the range of focus is for a given linewidth using standard resist formulations and a hybrid resist formulation of the present invention.

For example, we have found that with exposure on a DUV 0.5 NA lithography tool, the isofocal print bias for a hybrid resist can be 0.11 $\mu$m larger than the isofocal print bias for a standard negative tone resist, as exemplified in FIGS. 8 and 9 when standard calculations known in the art are performed on the data. This difference can be utilized in two ways. In one approach, the same reticle image size could be used with the hybrid resist to print a smaller line than the standard resist, while maintaining focus and exposure process latitude. In another manner of use, the size of the reticle features could be increased with the hybrid resist relative to the standard resist, while printing the same image size as the standard resist. The use of a larger reticle image provides a larger depth of focus due to reduced diffraction effects, as shown in the graph of FIG. 11. In the former application, higher performance is achieved with the smaller size of the hybrid resist. In the latter application, higher yield is achieved due to the larger process latitude of the hybrid resist.

The resist formulations may be varied to obtain a high photospeed positive tone reaction and a low photospeed negative tone reaction for optimal results. Additionally, the positive tone resist may be chosen so that it is insensitive to post expose bake (PEB) conditions so that the ratio of sensitivity of the positive tone to the negative tone function can be altered, thus changing the ratios of the space/line/space combinations.

Another option for changing the space/line/space ratios is to utilize a gray-scale filter in the reticle of the exposure tool. A gray scale filter only allows a portion of the radiation to pass through the reticle, thereby creating areas of intermediate exposure. This prevents the negative tone resist function from operating in these areas because the exposure dose would never reach the critical point, but would still allow the positive functions to occur, thereby creating wider spaces. This allows wider spaces to be printed at the same time as the narrower features, which is necessary in some device applications.

The following examples are exemplary of the frequency doubling resist composition, but are not meant to be limiting and many variations will be readily apparent to one of ordinary skill in the art.

The photoresist resins suitable for use in accordance with the invention include any of the base-soluble, long chain polymers suitable for use as a polymer resin in a photoresist formulation. Specific examples include: (i) aromatic polymers having an —OH group, e.g., polyhydroxystyrenes such as poly (4-hydroxystyrene), poly (3-hydroxystyrene), commercially available from Hoechst Celanese of Corpus Christi; Tex., novolak resins commercially available from Shipley of Marlboro, Mass.; and polymers having a phenolic —OH group, e.g., phenol formaldehyde resins; (ii) polymers having an acid group, e.g., polymethacrylic acid with an ester side chain; and (iii) acrylamide group type polymers.

The polymer resin in its deprotected form (i.e., once the positive tone reaction has occurred) is base soluble and compatible with developer solutions, such as aqueous solutions of metal-free ammonium hydroxide, tetramethylammonium hydroxide, and tetraethyl ammonium hydroxide, metal containing potassium hydroxide, and sodium metasilicate. Preferred polymer resins have an average molecular weight within the range of about 1,000 daltons to about 250,000 daltons, and most preferably within the range of about 1,000 to 25,000 daltons, to enhance its solubility in developer solutions. Examples include p-hydroxystyrene-maleic acid anhydride copolymers, polyhydroxystyrene-p-tertiarybutyl-carganatostyrene co-polymers, poly(2-hydroxystyrene), phenol-formaldehyde resins, polymethyl methacrylate-tertiary butyl methacrylate-polymethacrylic acid terpolymers, poly-4-hydroxystyrene-tertiary butyl methacrylate copolymers, poly(4-hydroxystyrene) with one or more acid labile alkyl or aryl substituents on the aromatic ring, a poly(3-hydroxystyrene) with one or more alkyl or aryl substituents on the aromatic ring, or any of these as the major number of subunits in a copolymer, such as PHM-C, commercially available from Maruzen America of New York, N.Y. The PHM-C includes both poly (hydroxystyrene) subunits and vinyl cyclohexanol subunits preferably being in the range of about 99:1 to about 50:50. The most preferred ratio is about 90 poly (hydroxystyrene) units to about 10 vinyl cyclohexanol subunits.

Crosslinking compositions are preferably tetramethoxymethyl glycouril ("Powderlink") and 2,6-bis(hydroxymethyl)-p-cresol. However, other possible crosslinking compositions include:

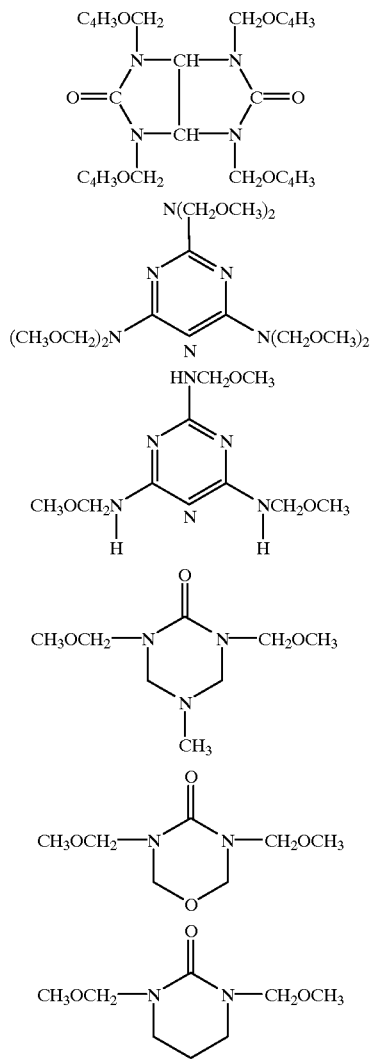

their analogs and derivatives, as can be found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/ butylated glycol-urils, for example of the formula:

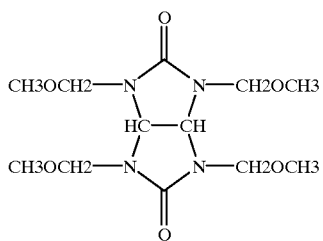

as can be found in Canadian Patent No. 1 204 547.

Photoacid generators ("PAG") include, but are not limited to: N-(trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxy-naphthalimide ("DDSN") may be used.

Possible base additives include, but are not limited to: dimethylamino pyridine, 7-diethylamino-4-methyl coumarin ("Coumarin 1"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. The preferred sensitizers will be nitrogen free, because the presence of nitrogen, e.g., an amine or phenothiazine group, tends to sequester the free acid generated during the exposure process and the formulation will lose photosensitivity.

A casting solvent is used to provide proper consistency to the entire composition so that it may be applied to the substrate surface without the layer being too thick or too thin. Sample casting solvents include: ethoxyethylpropionate ("EEP"), a combination of EEP and γ-butyrolactone ("GBL"), and propylene-glycolmonoethylether acetate (PM acetate).

In the following Examples, one of each of these has been chosen, however, it is to be recognized that many other compositions may be selected for various portions of the resist. In the broadest sense, the method and structure of the preferred embodiment may be achieved using any hybrid resist is comprised of a negative tone component and a positive tone component, wherein the positive tone component acts at a first actinic energy level and the negative tone component acts at a second actinic energy level, the first and second actinic energy levels being separated by an intermediate range of actinic energy levels.

EXAMPLE 1

The following compositions were dissolved in propylene-glycol monomethylether acetate (PM acetate) solvent available from Pacific Pac, Inc., Hollister, Calif. containing 350 ppm of FC-430, a non-ionic fluorinated alkyl ester surfactant available from 3M, St. Paul, Minn. for a total of 20% solids:

poly(hydroxystyrene) (PHS), 10% hydrogenated, available from Maruzen America, New York, N.Y. with about 25% of the phenol groups protected with methoxypropene (MOP), 81.2% of solids;

N-(trifluoromethylsulfonyloxy)-bicyclo-[2.2.1]-hept-5-ene-2,3-dicarboximide (MDT), available from Daychem Labs, Centerville, Ohio, 10.5% of solids;

tetramethoxymethyl glycouril (Powderlink), available from Cytec, Danbury, Conn., 8.2% of solids; and 7-diethylamino-4-methyl coumarin dye (Coumarin 1), available from the Aldrich Chemical Company, 0.1% of solids.

The solution was filtered through a 0.2 μm filter. The solution was coated onto silicon wafers primed with hexamethyl-disilazane with a soft bake of 110° Celsius (C.) resulting in films of about 0.8 μm thick as determined by a Nanospec reflectance spectrophotometer. The coated wafers were then exposed with deep ultraviolet (DUV) excimer laser radiation having a wavelength of 248 nm in a 0.37 numerical aperture (NA) Canon stepper with a matrix of different doses from low doses to high doses and post expose baked (PEB) at 110° C. for 90 sec. The dissolution rates of the exposed films were calculated from the thickness of remaining film after developing for a given amount of time with 0.14 Normal (N) tetramethylanmonium hydroxide (TMAH) developer. The dissolution rate vs. exposure dose relationship is shown in FIG. 6. As shown in FIG. 6, the resist has a very low dissolution rate (about 2 nm/sec) when unexposed. As the dose is increased, the dissolution rate increases until reaching about 50 nm/sec. The dissolution rate remains relatively constant at this level in the dose range of about 1 milliJoule (mJ) to about 3 mJ. Increasing the dose further, the negative cross-linking chemistry becomes predominant and the dissolution rate falls back to a value close to zero.

Figure 13:
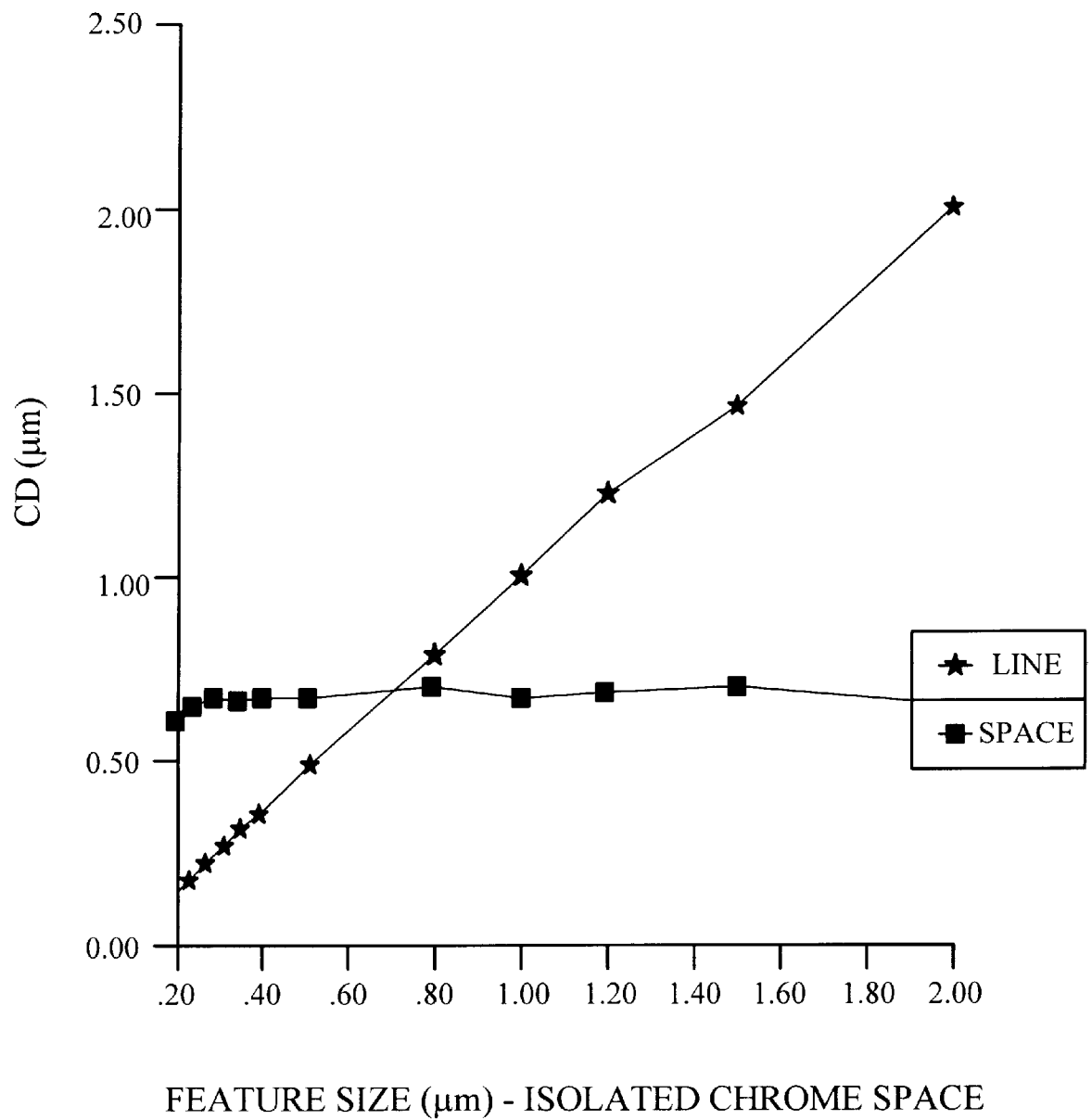
FIG. 13 is a graph showing the resultant line and space widths as functions of the chrome space width using one formulation of a hybrid resist of the present invention.

In another experiment with the same resist, when a MICRASCAN II 0.5 NA DUV stepper is used to expose an isolated chrome space onto the hybrid resist film, the space/line/space measurements as a function of width of the chrome space are plotted, as shown in FIG. 13. The data suggests that, although the width of the line increases correspondingly with that of the chrome space on the mask, the space on either side of the line remains relatively constant.

EXAMPLE 2

This example illustrates the manner in which changing the type of photoacid generator and relative amounts of the various components can change the dissolution rate characteristics of the hybrid resist and subsequently the lithographic response. This second formulation was prepared and processed in a manner similar to EXAMPLE 1, however, it is comprised of the following components:

PHS with about 25% of the phenol groups protected with MOP, 90.8% of solids;

triphenyl sulfonium triflate, 1.3% of solids;

Powderlink, 7.8% of solids;

tetrabutyl ammonium hydroxide base, 0.1% of solids; and sufficient PM acetate containing 350 ppm FC-430 surfactant as a solvent to form a 18.9% solids solution.

Figure 12:
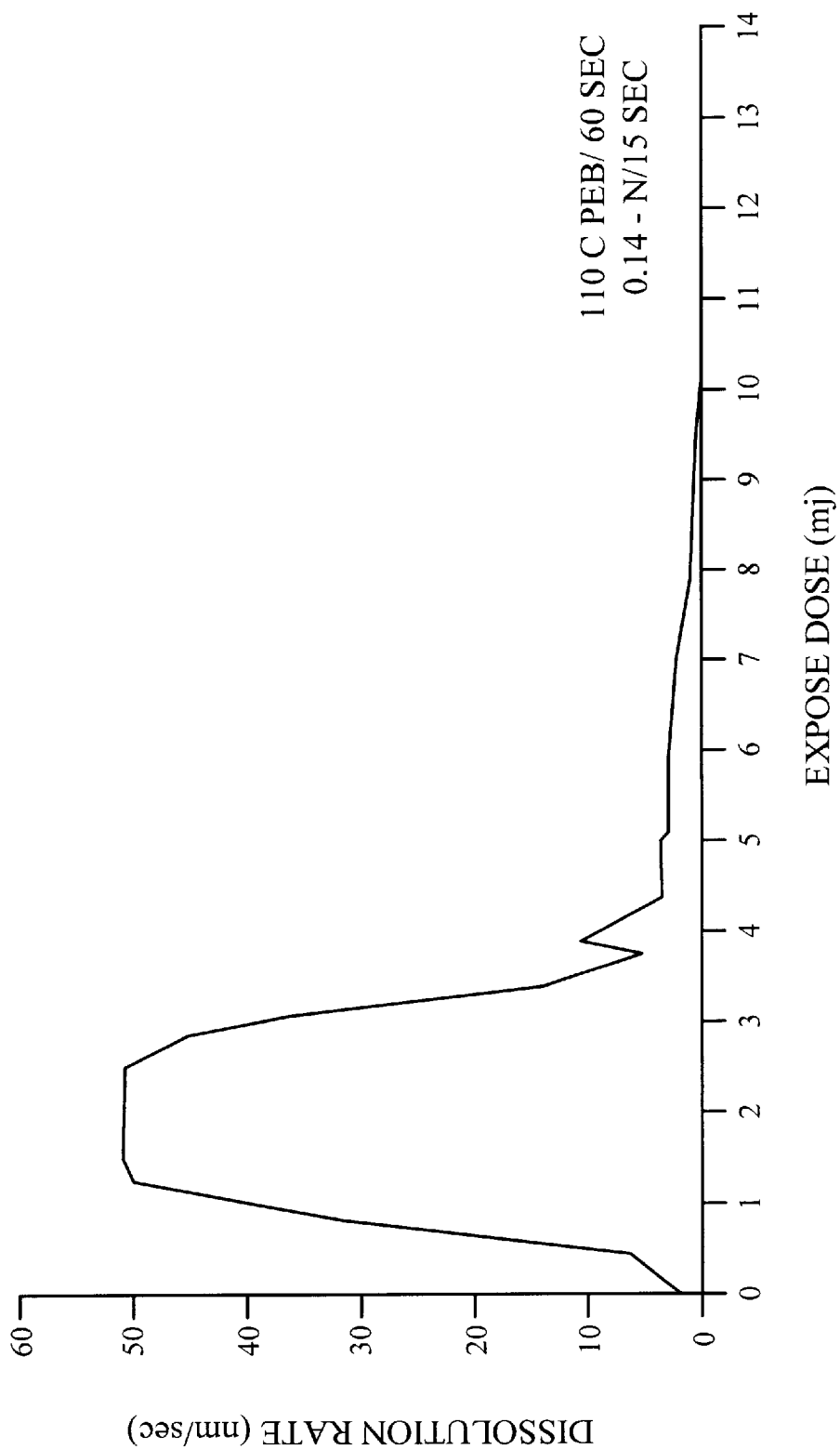
FIG. 12 is a graph showing the dissolution rate in nanometers per second (nm/sec) as a function of the exposure dose in milliJoules (mJ) using one formulation of a hybrid resist of the present invention.
Figure 14:
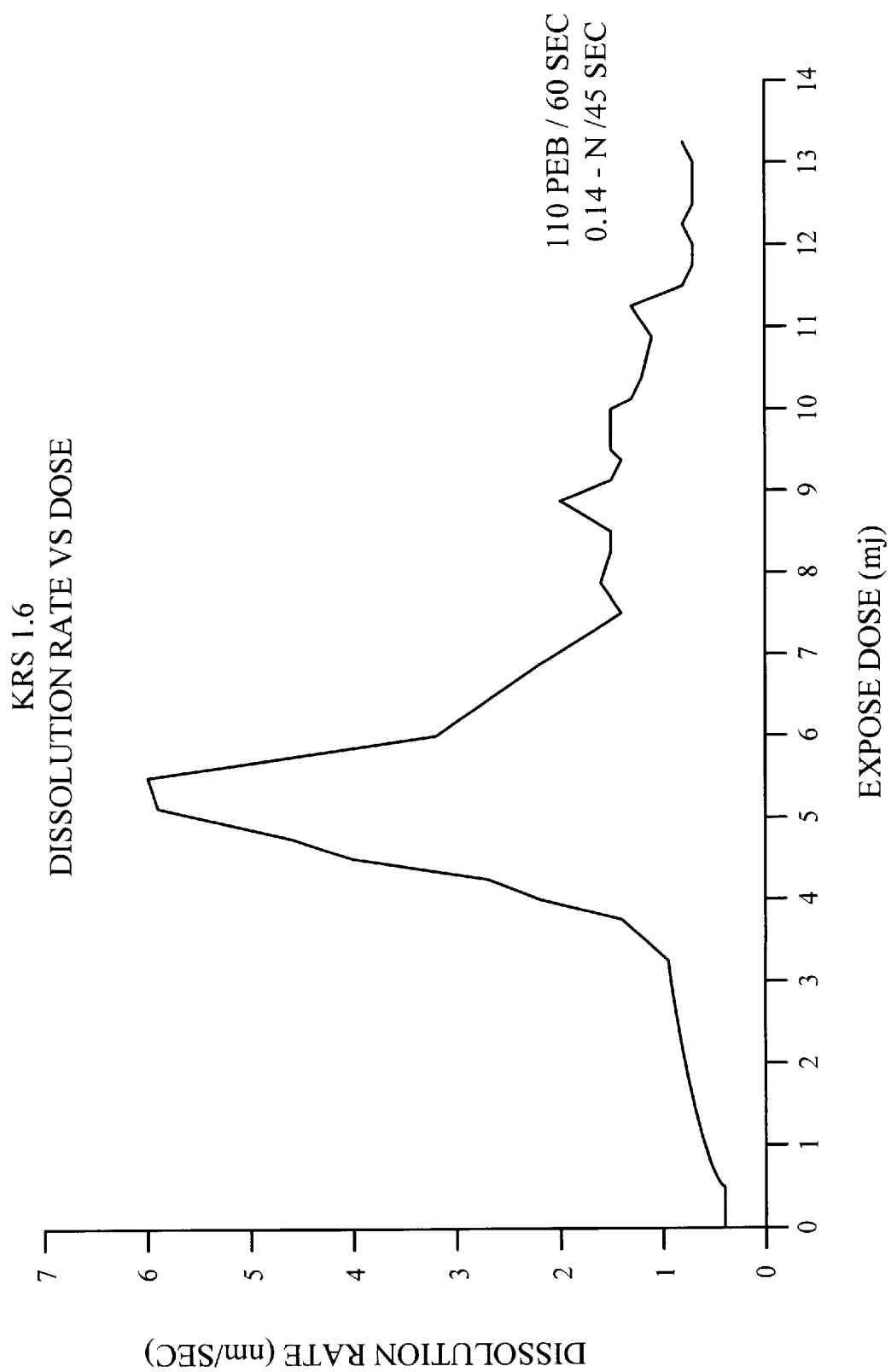
FIG. 14 is a graph showing the dissolution rate of an alternative formulation of the hybrid resist in nm/sec as a function of the exposure dose in mJ.

The dissolution rate characteristic of the resulting hybrid resist is shown in FIG. 14. The overall nature of the curve remains similar to that shown by the hybrid resist of EXAMPLE 1, in that the dissolution rate starts out low for an unexposed resist, increases to a high at about 5 mJ and decreases to a low above 7 mJ. However, the absolute dose range and the dissolution rates within these ranges are quite different from those shown in FIG. 12.

Figure 16:
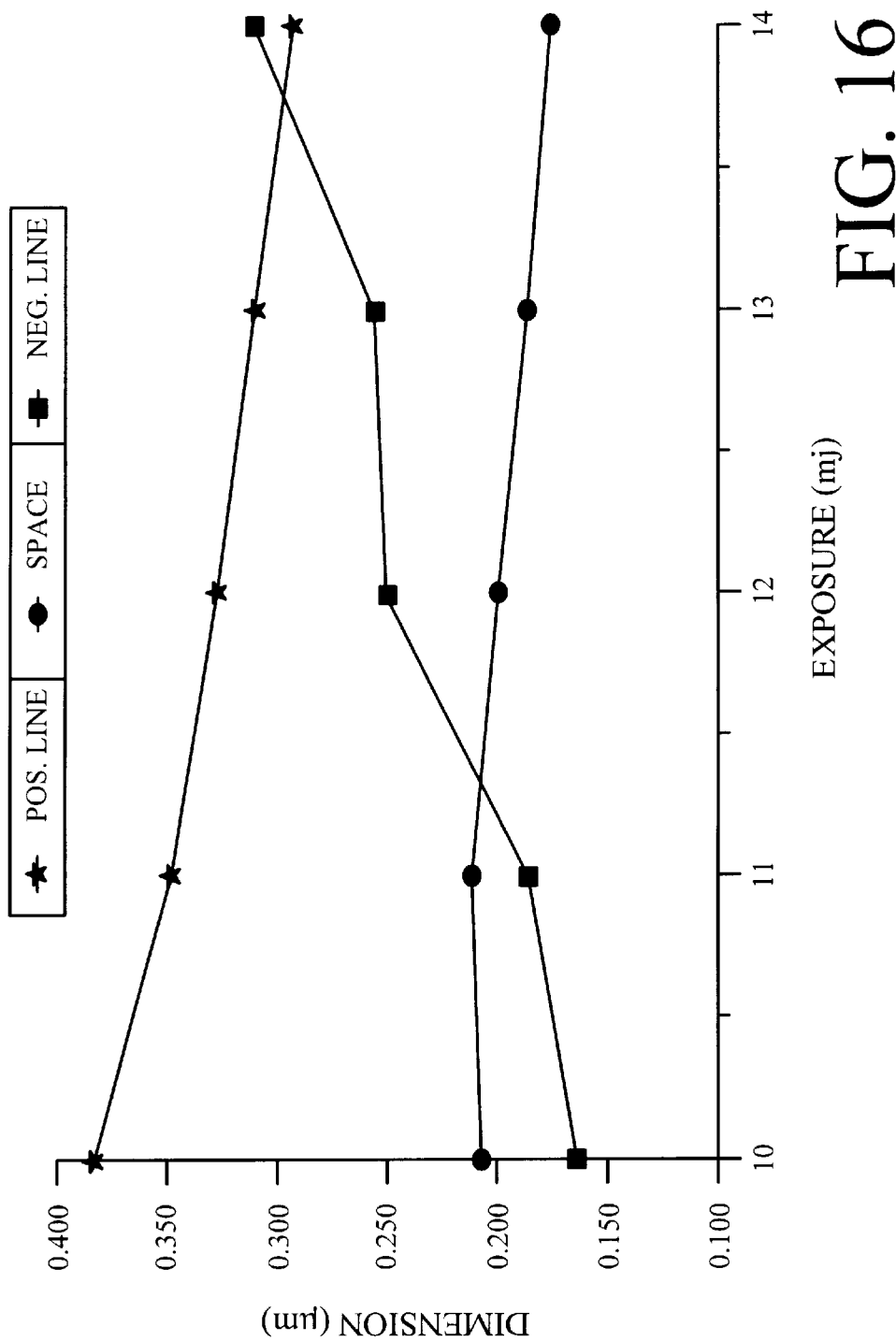
FIG. 16 is a graph of the response of a formulation of the hybrid resist of the present invention in which exposed (negative) line, unexposed (positive) line and space widths are plotted as a function of exposure dose.

FIG. 16 represents the response of this formulation of the hybrid resist when exposed through a mask of nested chrome lines and spaces of equal widths in a MICRASCAN II DUV 0.5 NA stepper tool. Negative line, unexposed (positive) line and space widths are plotted as a function of mask dimension. The space remains relatively constant in the range of about 0.18 $\mu$m, whereas both lines vary as the mask dimension is varied.

EXAMPLE 3

This example illustrates that the space width of the frequency doubled image can be changed by varying the protection level of PHS with MOP. Two different PHS lots having 24% and 15% MOP loading, respectively, were used to make hybrid formulations identical to that of EXAMPLE 1, except that the total solids contents were adjusted to 16.0% of the total to obtain film thicknesses of about 0.5 $\mu$m. From these two stock formulations, several other formulations with average MOP levels ranging from 15 to 24% were prepared. Wafers were coated and soft baked at 110° C., exposed on a MICRASCAN II DUV 0.5 NA stepper, post exposed baked at 110° C. for 60 sec and finally developed with 0.14N TMAH developer. A reticle with an isolated chrome opening was printed in a hybrid resist film The spacewidth of the resist image was measured and graphed as a function of the average MOP solubility inhibitor loading in the PHS used for making the respective formulations. It was found that the space width was strongly dependent on MOP concentration, as shown in FIG. 15.

EXAMPLE 4

Negative tone imaging may be performed with the hybrid resist of the present invention, using a blanket DUV expose after the PEB and prior to the develop.

A hybrid resist formulation as described in EXAMPLE 2, above, was image-wise exposed with a chrome reticle with an electrical test pattern on a 0.5 NA DUV expose system Silicon wafers (200 mm) with a 2000 Angstrom (Å) film of polysilicon were used as a substrate so that the resulting etched patterns of the resist image could be measured with electrical probe techniques. After the post expose bake process, the wafers were cycled back into the expose tool (MICRASCAN II) and exposed at 10 mJ per square centimeter ($cm^2$) with a clear glass reticle. A post expose bake process was not performed after the second exposure. The purpose of the second exposure was to remove the initially unexposed resist from the wafer, leaving only a negative tone resist pattern after develop.

The initial image-wise expose dose was 17–24 mJ/cm2, the post expose bake temperature was 110° C. for 90 sec and the develop time was 100 sec in 0.14N TMAH. A standard negative tone resist was processed in a similar fashion, with the omission of a blanket expose step as a control. The electrical data from this experiment is shown in FIGS. 8 and 9. A large isofocal print bias of approximately 0.11 $\mu$m was observed for the hybrid resist relative to the standard negative resist, as calculated using standard methods known in the art.

Preferred Embodiments

The preferred embodiments provide a method for forming spaces in the hybrid resist with varying widths. In particular, the preferred method facilitates the formation of spaces with different widths by using mask shapes (either openings or lines) that are smaller than can be normally resolved using the photolithography tool. Diffraction effects at these dimensions reduce the light intensity reaching the resist surface such that the hybrid resist receives an intermediate amount of exposure. These portions of hybrid resist that receive an intermediate exposure are soluble in developer and thus develop away to form spaces in the hybrid resist. Thus, spaces in the hybrid resist of varying widths can be formed.

Figure 19:
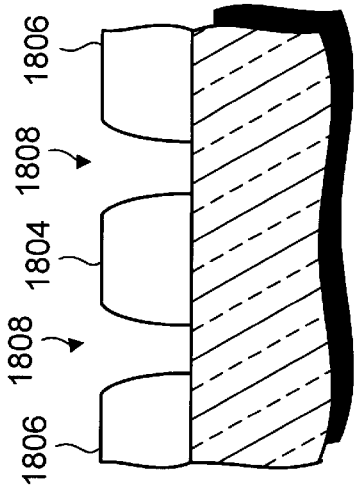
FIG. 19 is a cross-sectional side view of the wafer portion of FIG. 18 taken along line 19—19.
Figure 20:
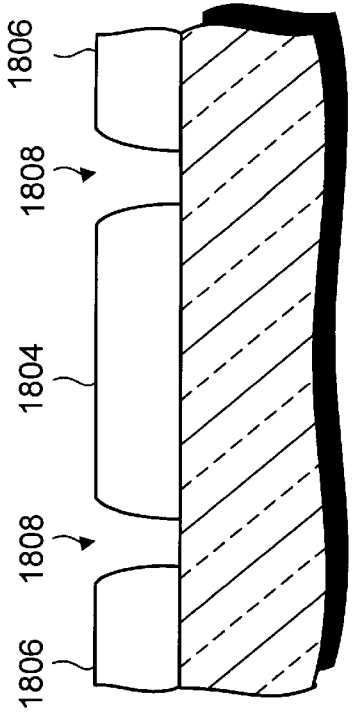
FIG. 20 is a cross-sectional side view of the wafer portion of FIG. 18 taken along line 20—20.
Figure 17:
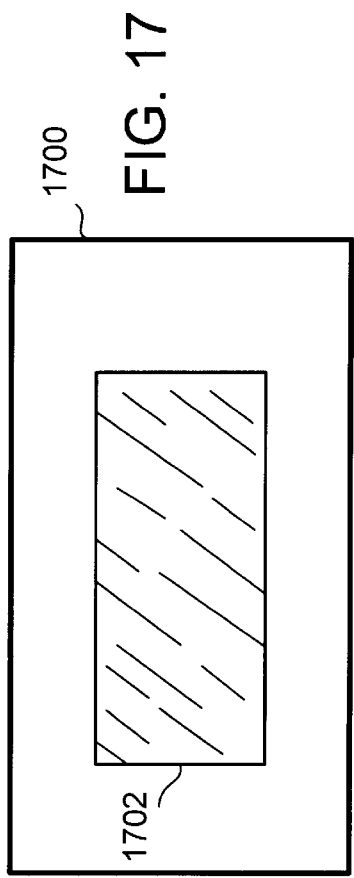
FIG. 17 is a schematic view of an exemplery mask portion.
Figure 18:
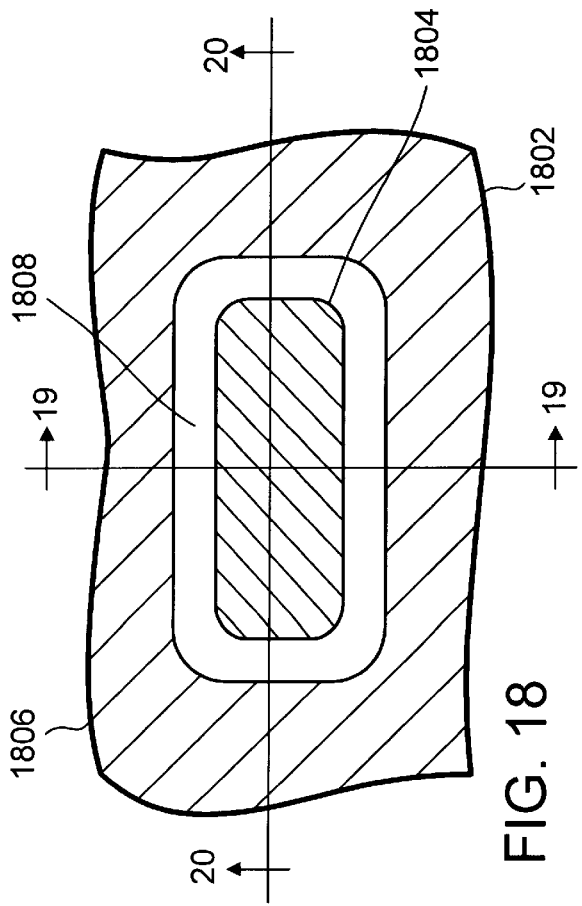
FIG. 18 is a top schematic view of a wafer portion with patterned hybrid resist upon it.

When hybrid resist is exposed to actinic energy, areas of the resist which are subject to a full exposure form a negative tone line pattern, areas which are unexposed form a positive tone pattern, and areas which are exposed to intermediate amounts of radiation become soluble and wash away during development. Turning to FIG. 17, an exemplary mask 1700 containing a mask blocking shape 1702 is illustrated. When hybrid resist is deposited on a wafer, exposed through mask 1700 with actinic radiation, and developed, the mask 1700 creates a "linked" or "donut" pattern in the hybrid resist. Such a linked pattern is illustrated FIGS. 18, 19 and 20, where FIG. 19 is a cross section of the wafer in FIG. 18 taken along lines 19—19, and FIG. 20 is a cross section of the wafer in FIG. 18 taken along lines 20—20.

Hybrid resist portions which are unexposed (i.e., the inside region 1804 blocked by mask shape 1702) remain photoactive and insoluble in the developer and form positive tone line patterns. Hybrid resist portions which are exposed with high intensity radiation (i.e., the outside region 1806 not blocked by mask shape 1702) are completely cross-linked during the post-exposure bake and form a negative tone line pattern. Hybrid resist portions which are exposed with intermediate amounts of intensity (i.e., the areas under the edges of mask shape 1702) become soluble in developer solution after the first exposure and post-exposure bake and are dissolved during the development step and form space 1808 in the hybrid resist.

Portions of the hybrid resist which were unexposed during the first exposure remain photoactive. These portions can be removed by blanket exposing the wafer, such that these positive tone resist patterns are solubilized and can be washed away during development. The blanket exposure is preferably an intermediate exposure, either by exposing at a low enough dose or for a short enough time to create an intermediate response to those areas of resist that were unexposed (i.e, the positive tone patterns) in the first exposure step.

In the alternative, the positive tone portions can be removed by a selective etch using a solution of pure n-butyl acetate at room temperature or with a strong base, such as 0.35 Normal ("N") tetramethyl ammonium hydroxide ("TMAH").

Figure 22:
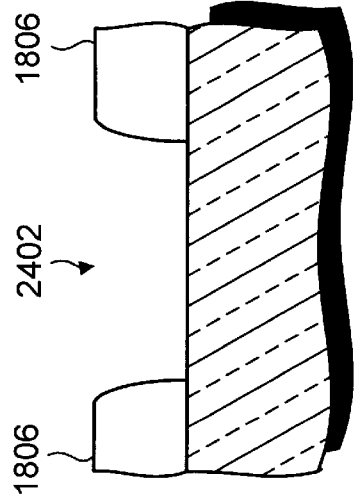
FIG. 22 is a cross-sectional side view of the wafer portion of FIG. 21 taken along line 22—22.
Figure 23:
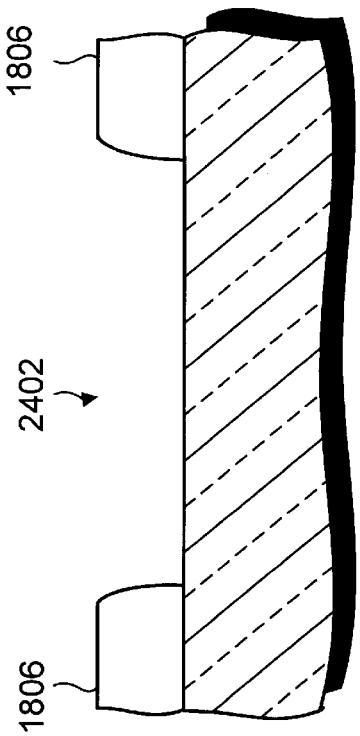
FIG. 23 is a cross-sectional side view of the wafer portion of FIG. 21 taken along line 23—23.
Figure 21:
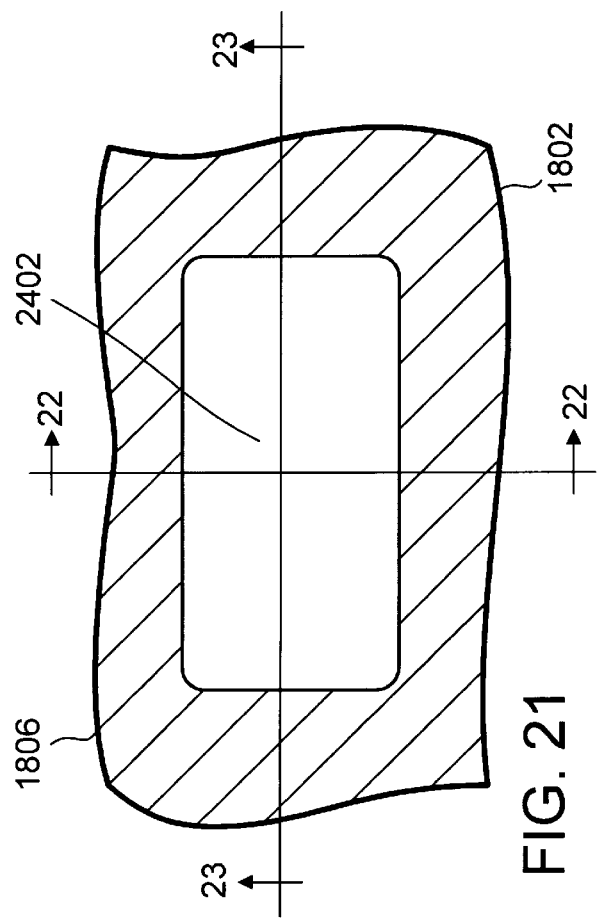
FIG. 21 is a top schematic view of a wafer portion with patterned hybrid resist and positive tone portions removed.
Figure 24:
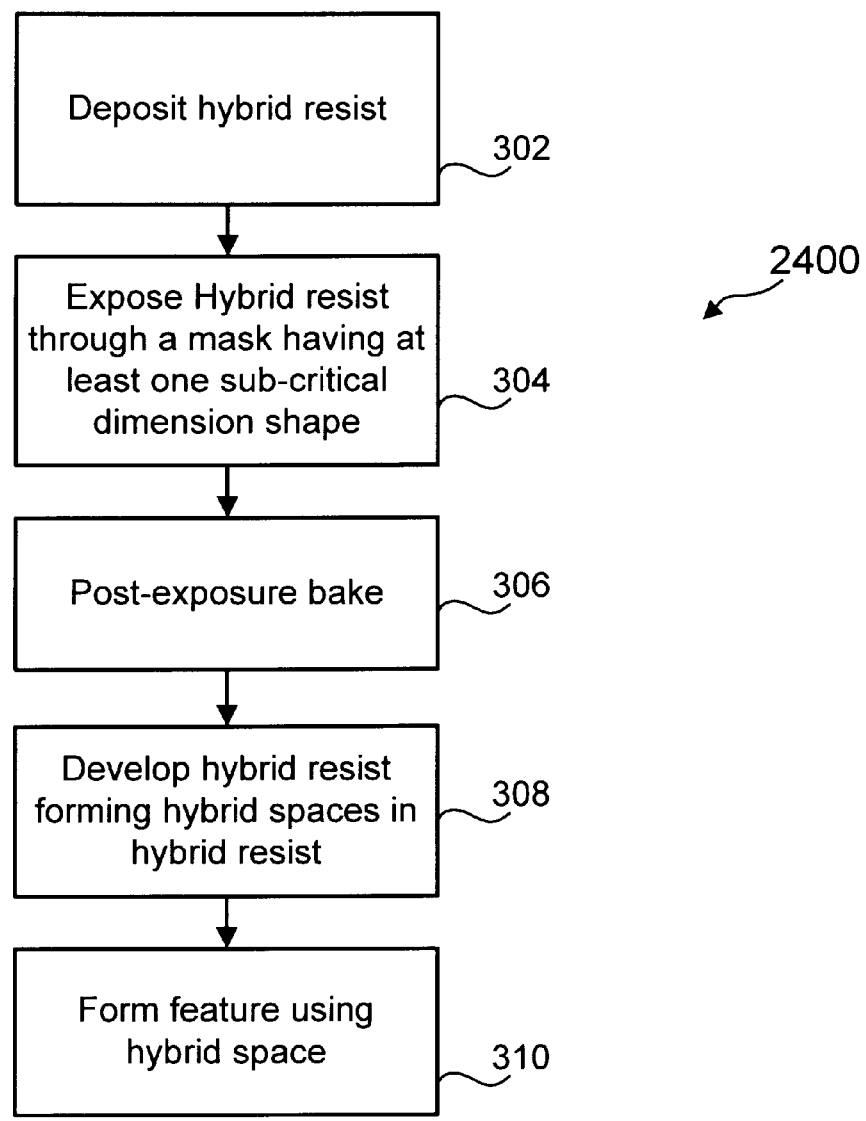
FIG. 24 is a flow diagram illustrating a method in accordance with a preferred embodiment method.

Turning to FIGS. 21, 22, and 23, the wafer portion 1802 is illustrated after a blanket exposure and development, where FIG. 22 is a cross section of the wafer portion in FIG. 24 taken along lines 22—22, and FIG. 23 is a cross section of the wafer taken along lines 23—23.

The blanket exposure has caused the positive tone regions (i.e., the hybrid resist portion 1804 (of FIGS. 18, 19 and 20)) which were unexposed (i.e., blocked by mask shape 1702) to become soluble and wash away during development.

It should be noted that the width of the spaces 1808 formed under the edges of mask shape 1702 after the first exposure correspond to width of hybrid resist area that is exposed to intermediate amounts of radiation. Thus, the main factors in determining the width of these spaces is the amount of diffraction that occurs at the edge of the mask shape 1702 and the exposure response profile of the resist formulation used. As such, the width of the spaces is independent of other parameters such as exposure dose. This unique property of hybrid resist thus allows for spaces with very consistent linewidth to be formed, at smaller dimensions than are possible using normal resist. These same properties however make it difficult for spaces to be formed with different space widths during the same fabrication steps.

Turning to FIG. 24, a method 2400 for forming spaces with different sizes using hybrid resist is illustrated. The preferred method facilitates the forming of spaces in the hybrid resist having different widths without requiring additional processing steps. Furthermore, the spaces created using the preferred method can be reliably formed with a sub-critical width- meaning that the spaces are formed smaller than could be formed with conventional resist.

The first step 302 in method 2400 is to deposit hybrid resist. The hybrid resist chosen can be any suitable hybrid resist, but is preferably selected to have an exposure profile that results in hybrid spaces having the desired width. In particular, the amount of exposure which constitutes an intermediate exposure (i.e., one that triggers the hybrid response but does not trigger the negative tone response) is dependent upon the hybrid resist formulation used. The width of the hybrid resist regions that receive this intermediate amount of exposure is dependent upon the amount of diffraction effects that occur at the edges of mask shapes when using the exposure tool. Thus, by selecting an appropriate hybrid resist formulation and exposure tool, hybrid spaces having the desired width are consistently and accurately formed.

The next step 304 is to expose the hybrid resist through a mask having at least one sub-critical dimension shape. A sub-critical dimension shape is a shape that has at least one dimension which is smaller than can be resolved with the exposure system Because a sub-critical dimension shape is smaller than can be resolved by the exposure system, diffraction effects cause the hybrid resist area corresponding to that sub-critical dimension shape to be exposed to intermediate exposure. Stated another way, diffraction effects cause the regular hybrid spaces that are normally formed at only at the edges of a shape to fuse together.

One way to define a sub-critical dimension shape is using the Rayleigh equation. The Rayleigh equation is commonly used for determining the resolution of a exposure tool (i.e., the minimum feature size that can be reliably reproduced using conventional photoresist, chrome-on-glass masks, and standard illumination systems). The Rayleigh equation defines the resolution as:

$$\text{resolution} = k\left(\frac{\lambda}{NA}\right)$$

where $\lambda$ is the exposure wavelength, NA is the numerical aperture of the system, and k is the lithographic constant for this process. The Rayleigh model thus correlates the resolution of a lithography system with the exposure wavelength and the numerical aperture of that system. In particular, the resolution is proportional to the wavelength divided by the numerical aperture. In conventional lithography process manufacturing operations the k value is typically limited to values greater than 0.6. For higher resolution features (i.e., smaller feature dimensions) diffraction effects on the aerial image become very significant, causing a loss of expose intensity and a broadening of the pattern.

The particular sub-critical dimension needed for intermediate exposure across the whole dimension would depend on the resist formulation used and the exposure system parameters. As such, in the preferred embodiment, sub-critical dimension features are used that correspond to k values of less then approximately 0.55. When such sub-critical dimension features are used, diffraction effects cause the exposure intensity to be reduced such that the entire region corresponding to the sub-critical dimension shape receives an intermediate exposure, causing only a space to be formed in the resist with the negative tone line being absent. This applies regardless of the other parameters, such as numerical aperture and the amount of image reduction (e.g., Nx=1x, 4x, etc.) in the exposure system.

Thus, by exposing through a mask having at least one sub-critical dimension shape, areas under the sub-critical dimension shape will receive an intermediate exposure by virtue of the diffraction effects around and through the shape. In particular, where the sub-critical dimension shape is a non-blocking shape, diffraction effects prevent the middle areas from being fully exposed and becoming negative tone patterns. Likewise, where the sub-critical dimension shape is a blocking shape, diffraction effects prevent the middle areas from remaining totally unexposed, positive tone patterns. In both cases, the regions corresponding to the sub-critical dimension shape receive an intermediate level exposure.

Figure 25:
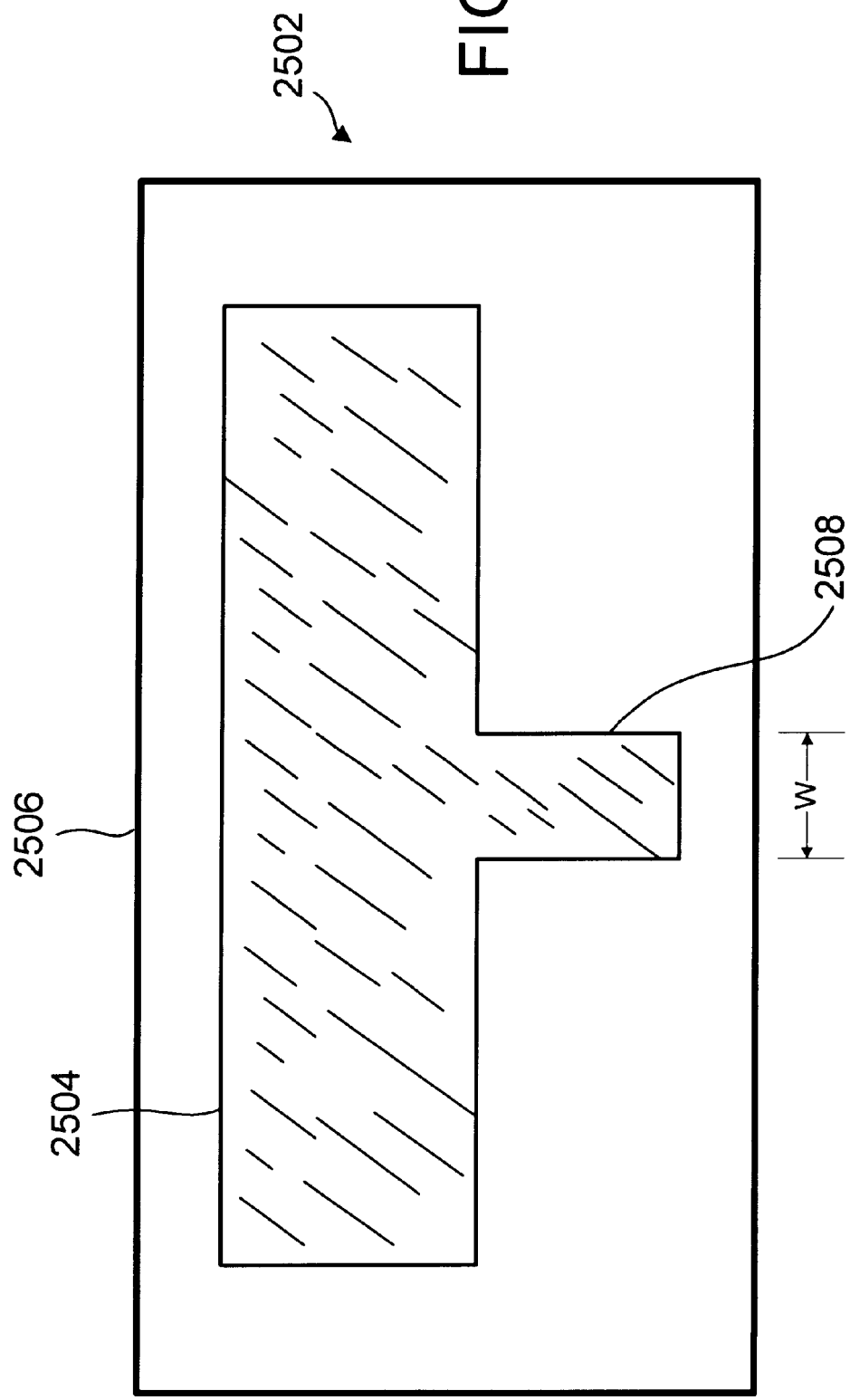
FIG. 25 is a schematic view of a mask portion in accordance with a preferred embodiment.

Turning to FIG. 25, an exemplary mask portion 2502 is illustrated. The mask portion 2502 includes a blocking shape 2504 (illustrated with hatching lines) surrounded by a non-blocking region 2506. The blocking shape 2504 includes a portion 2508 having a sub-critical dimension. In particular, the portion 2508 has a width, illustrated as dimension W, which is smaller than can be resolved with an exposure tool. By exposing hybrid resist through mask portion 2502, areas of hybrid resist corresponding to the edges of the mask shape 2502 are exposed to intermediate amounts of radiation, as discussed previously. Furthermore, diffraction effects cause areas of hybrid resist corresponding to the portion 2508 to also be exposed to intermediate amounts of exposure.

Returning to method 2400 illustrated in FIG. 24, the next step 306 is to perform a post-exposure bake of the hybrid resist. As discussed above, with most hybrid resist formulations, a post exposure bake is used to trigger the hybrid resist response. In particular, the post-exposure bake causes regions of hybrid resist that have been exposed with intermediate amounts of intensity to become soluble to developer. Additionally, the post-exposure bake causes the negative tone areas to become fully cross linked and therefore insoluble to developer.

The next step 308 is to develop the exposed hybrid resist. Areas of the hybrid resist that were not blocked during exposure and hence fully exposed become cross linked and form a negative tone pattern. Areas of the hybrid resist blocked during exposure remain unexposed and photoactive, and hence comprise a positive tone pattern. Areas of hybrid resist that were exposed to intermediate amounts of exposure wash away during development.

Figure 26:
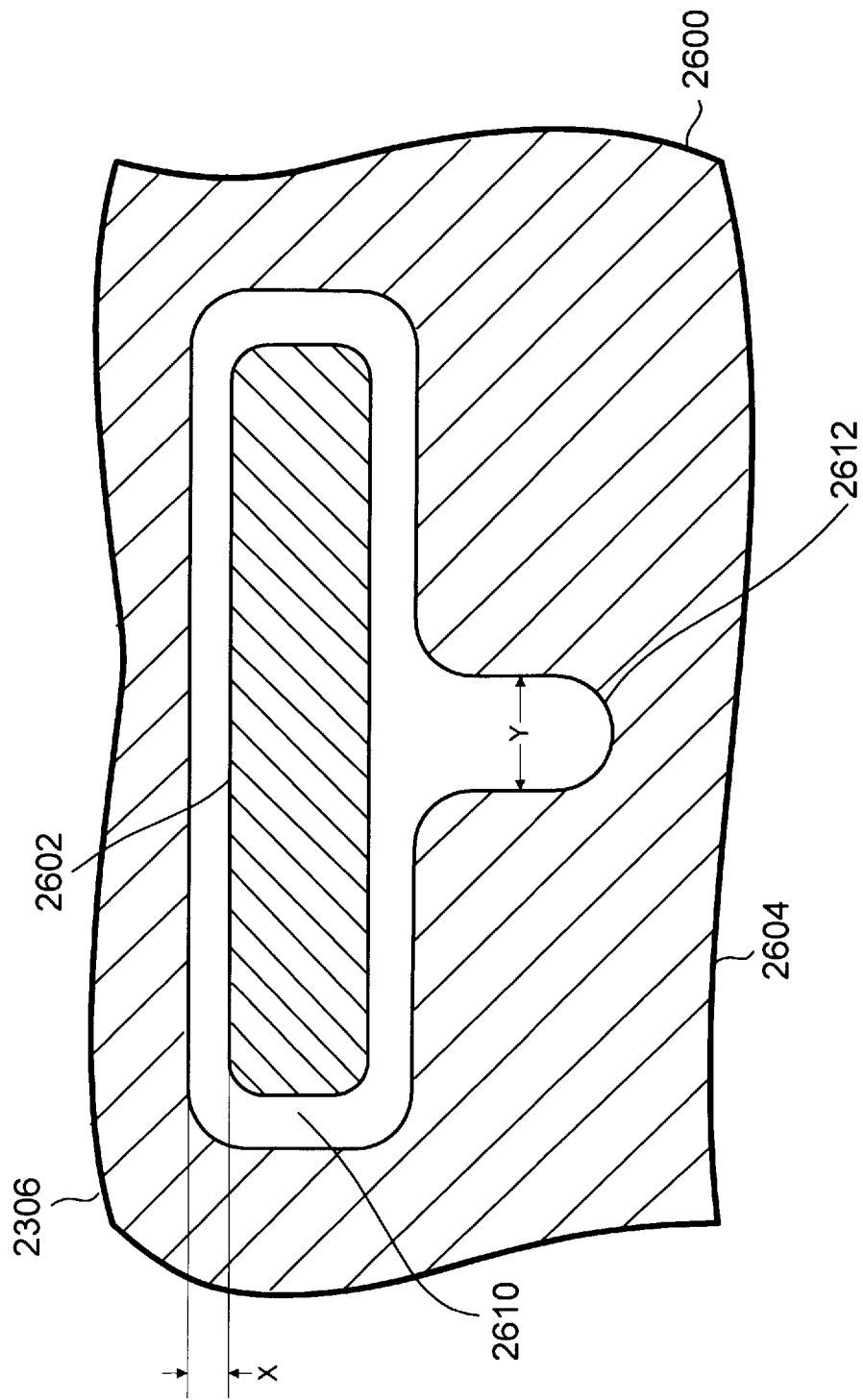
FIG. 26 is a schematic view of a wafer portion in accordance with a preferred embodiment.

Turning to FIG. 26, a wafer portion 2600 is illustrated upon which hybrid resist has been deposited, exposed through mask portion 2502 (FIG. 25), post-exposure baked, and developed in accordance with steps 302–308. Having been thus exposed, the hybrid resist portions which were unexposed in step 304 (i.e., the regions corresponding to the main body of mask shape 2504) remain insoluble in the developer and form a positive tone pattern 2602 of hybrid resist. Hybrid resist portions which are exposed with high intensity radiation (i.e., the regions corresponding to non-blocking portion 2506) form a negative tone pattern 2604 of hybrid resist. Hybrid resist portions which are exposed with intermediate amounts of intensity (i.e., the areas corresponding to the edges of blocking mask shape 2504 and the areas corresponding to the sub-critical dimension shape portion 2504) are dissolved during the development step. This forms the feature space 2610 corresponding to the edge of the blocking mask shape 2504 and a feature space 2612 corresponding to the sub-critical dimension shape portion 2504.

The width of the feature space 2610 (indicated in FIG. 26 as the width X) is determined by the width of the hybrid resist region that receives an intermediate amount of exposure due to diffraction effects at the edge of mask blocking shape 2504. One of the advantages of hybrid resist is that these intermediate exposure spaces formed under the edges of mask shapes can be printed with a width of less than 0.2 $\mu$m with current deep ultra violet (DUV) lithography tools that are designed for operation at 0.35 $\mu$m resolution. Thus, by using the edge of a mask shape to define spaces in hybrid resist, smaller dimension features can be created than normal lithography allows.

According to the preferred embodiment of the present invention, feature spaces can be formed with different dimensions during the same fabrication steps. In particular, the width of feature space 2612 (indicated in FIG. 26 as the width Y) is determined by the diffraction effects caused by the sub-critical dimension mask shape 2508. Because mask shape 2508 has a dimension which is too small to be resolved by the exposure tool, diffraction effects cause an intermediate exposure to occur under the entire region which corresponds to the mask shape, and not just around the edges of the mask shape as with larger mask shapes. Thus, by exposing hybrid resist through a mask shape having at least one sub-critical dimension shape, feature spaces having different dimensions can be created with a single processing step. Additionally, both feature spaces created by diffraction effects at the edge of mask shapes and those created by diffraction effects of sub-critical dimension shapes can be formed with smaller dimensions than would normally be possible with the exposure tool.

Returning to the method 2500, the next step 310 is to form at least one feature using the created hybrid spaces. Because of the flexibility of the preferred method, the hybrid spaces can be used to create many different types of features. For example, wiring lines can be formed in the hybrid spaces, with the larger areas formed with sub-critical dimension spaces being used as contacts for the wiring lines. As another example, implants into underlying semiconductor material can be made through the hybrid spaces. As will be understood by those skilled in the art, these are only two examples of many types of features that can be formed using many different types of processing using the hybrid spaces formed according to the preferred embodiments.

This future processing can include additional exposures which trigger the remaining positive tone patterns in the hybrid resist (e.g., positive tone line pattern 2602), causing them to become soluble in developer while leaving the negative tone line patterns (e.g., negative tone line pattern 2604).

One variation on the preferred embodiment is to use a grating of sub-critical dimension shapes together to expose a large area of hybrid resist to intermediate amounts of radiation. In particular, by placing a plurality of sub-critical dimension shapes adjacent to one another, a larger region of intermediate exposure can be created than would be possible using a single shape.

The preferred method can be applied to form a wide variety of features in many types of devices. One of these applications is the fabrication of dynamic random access memory chips or DRAM chips. DRAM chips are used extensively in computer applications where large amounts of inexpensive yet relatively high performance memory is needed. As more advanced applications are developed, an increasingly large amount of DRAM is needed. This has driven an ever increasing need for greater device densities and economical ways of producing these devices.

A typical DRAM chip is made of millions of individual DRAM "cells." Each cell contains a capacitor used for the memory charge, a switch used to access the capacitor, and some isolation regions around these devices. The individual cells are accessed using a large number of bit lines and word lines. By selecting an appropriate bit line and word line, a memory controller can access information contained in the desired DRAM cells.

Hybrid resist and the preferred method can be used to create DRAM cells in higher densities than can be achieved using standard photolithography. As an example, the preferred method can be used in the definition of the active areas and the formation of shallow trench isolation in DRAM devices. In particular, the preferred method can be used in the formation of shallow trench isolation (STI) regions that isolate elements of the DRAM cells from one another. By using hybrid resist to form the STI regions, they can be formed at smaller dimensions than would be possible using conventional resist.

Suitably, the STI regions are formed by depositing hybrid resist and exposing it through a mask, causing areas that were exposed to intermediate amounts of radiation to become soluble and wash away during development, forming spaces in the resist. STI trenches can then be etched through the openings in the hybrid resist.

Figure 27:
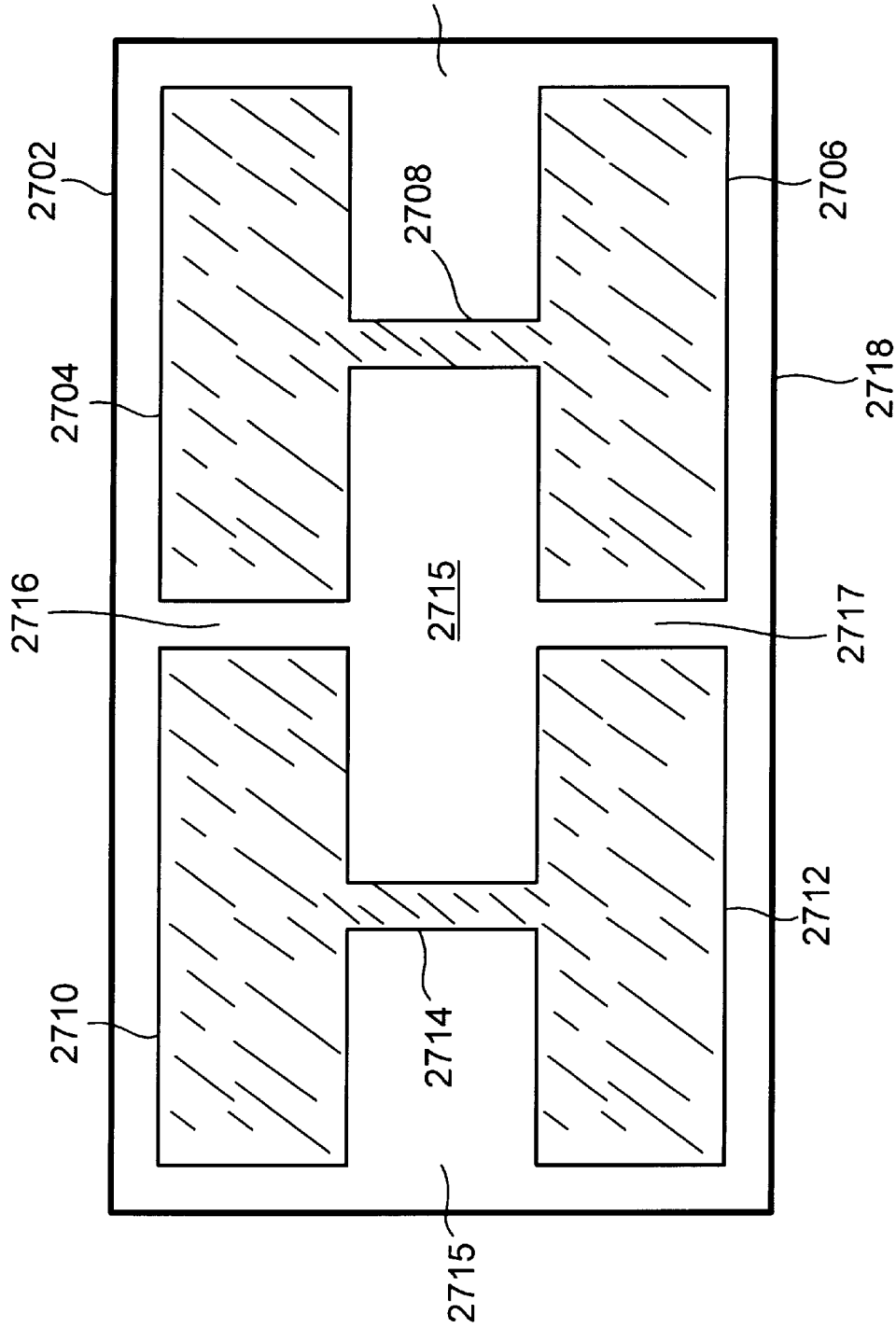
FIG. 27 is a schematic view of a second mask portion in accordance with a preferred embodiment.

Turning to FIG. 27, a mask portion 2702 is shown that is exemplary of mask portions used to define active areas and form STI in DRAM devices in accordance with the preferred method. The mask portion 2702 is used to form STI regions between adjacent DRAM cells and between adjacent trench capacitors. In accordance with the preferred method, the STI regions between adjacent DRAM cells can be formed with a different width (i.e., narrower) than the STI regions at ends of the active areas. The mask portion 2702 includes a blocking shape 2704 and a blocking shape 2706 connected by a sub-critical dimension blocking shape 2708. The mask portion also includes a blocking shape 2710 and a blocking shape 2712 connected by a sub-critical dimension blocking shape 2714. All the blocking shapes are surrounded by non-blocking regions 2716, 2717 and 2715. Between blocking shape 2704 and 2710 is a sub-critical dimension non-blocking shape 2716. A second sub-critical dimension non-blocking shape 2717 is formed between blocking shape 2706 and 2712. Again, the width of the sub-critical dimension shapes 2708, 2714, 2716 and 2717 are smaller than can be resolved with the exposure tool. Thus, by exposing hybrid resist through mask portion 2702, diffraction effects cause areas of hybrid resist corresponding to the sub-critical dimension shapes 2708, 2714, 2716 and 2717 to be exposed to intermediate amounts of exposure. Additionally, areas of hybrid resist corresponding to the edges of the mask shapes 2704, 2706, 2710 and 2712 are exposed to intermediate amounts of radiation, as discussed previously.

Figure 28:
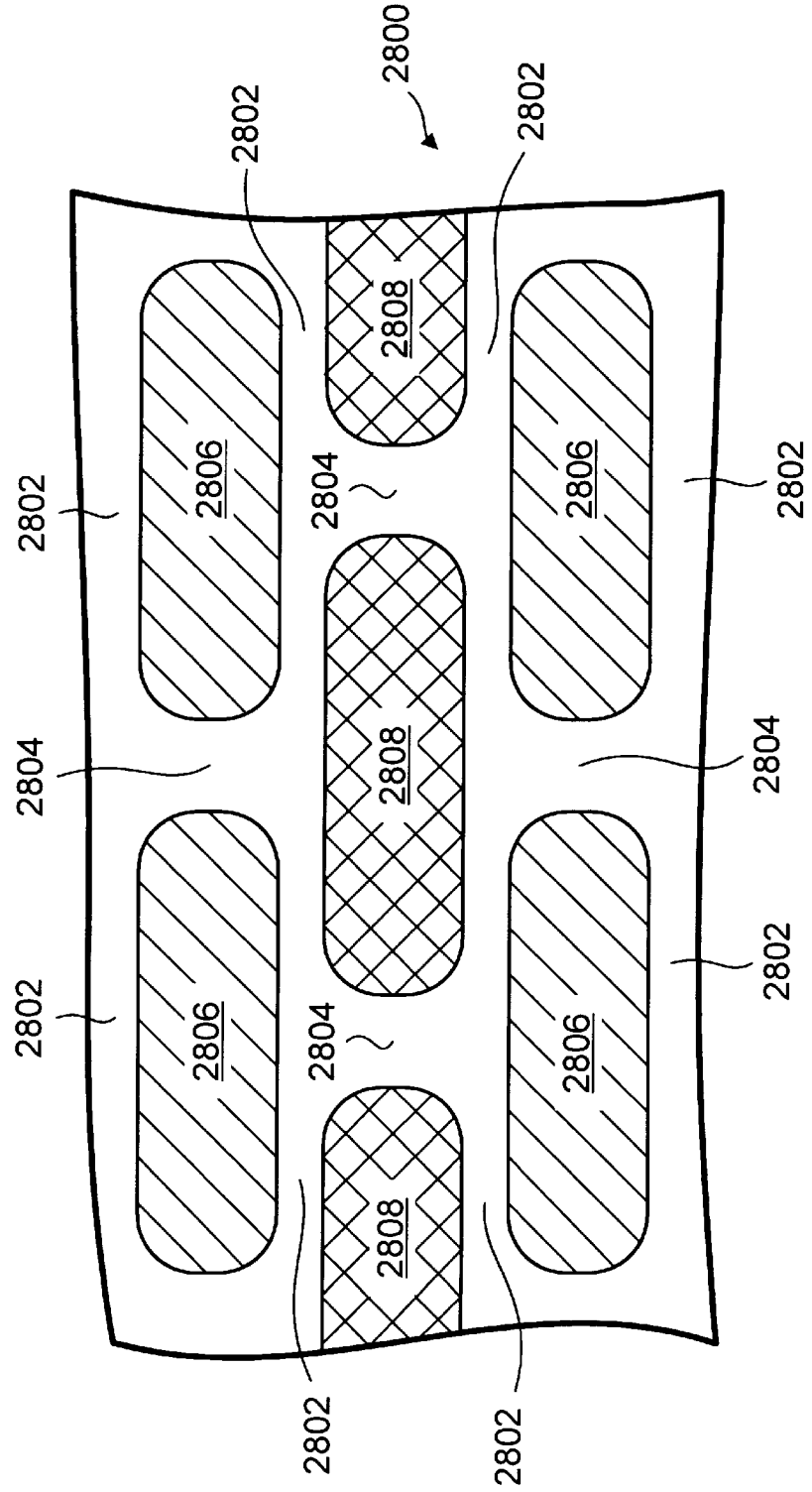
FIG. 28 is a schematic view of a second wafer portion in accordance with a preferred embodiment.

Turning to FIG. 28, a wafer portion 2800 is illustrated after having been covered with hybrid resist, exposed through mask portion 2702, post exposure baked and developed. Again, this process causes areas of hybrid resist that were exposed to intermediate amounts of exposure to become soluble and wash away during development. In particular, areas of hybrid resist corresponding to the edges of blocking mask shapes 2704, 2706, 2710 and 2712 are exposed to intermediate amounts of radiation and are washed away during development, forming spaces 2802. Spaces 2802 can then be used to form STI between adjacent DRAM cells. Likewise, hybrid resist areas corresponding to the sub-critical dimension shapes 2708, 2714, 2716 and 2717 are exposed to intermediate amount of radiation and wash away during development, forming spaces 2804. Spaces 2804 can then be used to form STI between adjacent trench capacitors.

Hybrid resist portions which were unexposed (i.e., the regions corresponding to blocking mask shapes 2704, 2706, 2710 and 2712) remain insoluble in the developer and form positive tone patterns 2806 of hybrid resist. Hybrid resist portions which are exposed with high intensity radiation (i.e., the regions corresponding to non-blocking portions of mask portion 2702) form a negative tone line pattern 2808 of hybrid resist.

The width of spaces 2802 are determined by the amount of diffraction at the edges of the blocking mask shapes and the exposure profile of the hybrid resist. The width of spaces 2804 are determined by the diffraction effects caused by the sub-critical dimension mask shapes 2708, 2714, 2716 and 2717. Because the sub-critical dimension mask shapes have a dimension which is too small to be resolved by the exposure tool an intermediate exposure occurs under the entire region corresponding to the sub-critical dimension mask shape. Thus, STI regions of two different widths can be formed using hybrid resist and the preferred method with a single processing step.

In a suitable applications, after the spaces have been formed in the hybrid resist, shallow trench isolation structures are then formed in the wafer by etching through the hybrid spaces. The hybrid resist is then stripped, the trenches filled (suitably with a nitride liner and an oxide core), and wafer polished and planerized. This forms STI regions between adjacent DRAM cells and between adjacent trench capacitors.

A second application in which the preferred method can be used is in the fabrication of static random access memory (SRAM). The term static is derived from the fact that SRAM needs to be refreshed less often than DRAM. Because SRAM does not need to refresh between accesses as DRAM does, a typical SRAM has a much faster access time. In particular, while DRAM memory typically supports access times of about 60 nanoseconds, SRAM can give access times as low as 10 nanoseconds. Unfortunately, SRAM is typically much more expensive than DRAM, and thus is only used in applications where high speed is at a premium such as in memory caches.

The preferred method can be used to form gate conductors and local level interconnects in SRAM devices. An example of such an application follows. Following the formation of the underlying devices that make up a SRAM device, a suitable hard mask (e.g. silicon dioxide or silicon nitride) is deposited on the wafer portion. Hybrid resist is then deposited on the hard mask, exposed and developed.

Figure 29:
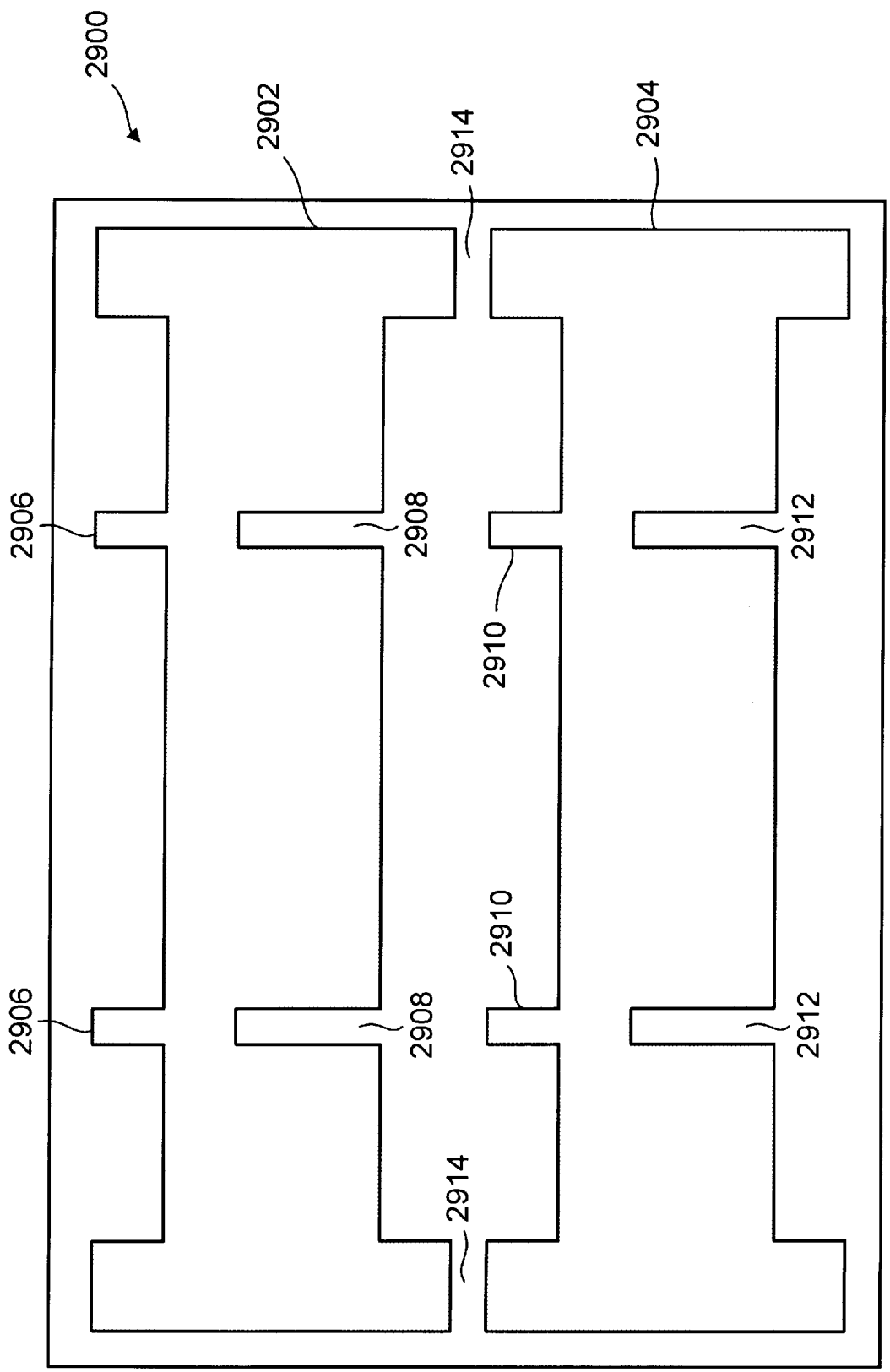
FIG. 29 is a schematic view of a third mask portion in accordance with a preferred embodiment.

Turning to FIG. 29, a mask portion 2900 which is exemplary of a mask which can be used at this step to form gate conductors in a SRAM device, along with relatively wide gate contact areas. The mask portion 2900 includes two shapes 2902 and 2904. Both shapes include a plurality of sub-critical dimension portions in accordance with the preferred method. In particular, mask shape 2902 includes sub-critical dimension protrusions 2906 and sub-critical dimension gaps 2908. Likewise, mask shape 2904 includes sub-critical dimension protrusions 2910 and sub-critical dimension gaps 2912. Another two sub-critical dimension shapes 2914 are formed between the mask shapes 2902 and 2904. All of the sub-critical dimension shapes 2906, 2908, 2910, 2912 and 2914 have at least one dimension which is smaller than can be accurately patterned using the exposure tool. As explained above, when hybrid resist is deposited and exposed through mask portion 2900, diffraction effects around the sub-critical dimension shapes causes areas of hybrid resist corresponding to those shapes to be exposed to intermediate amounts of radiation.

Figure 30:
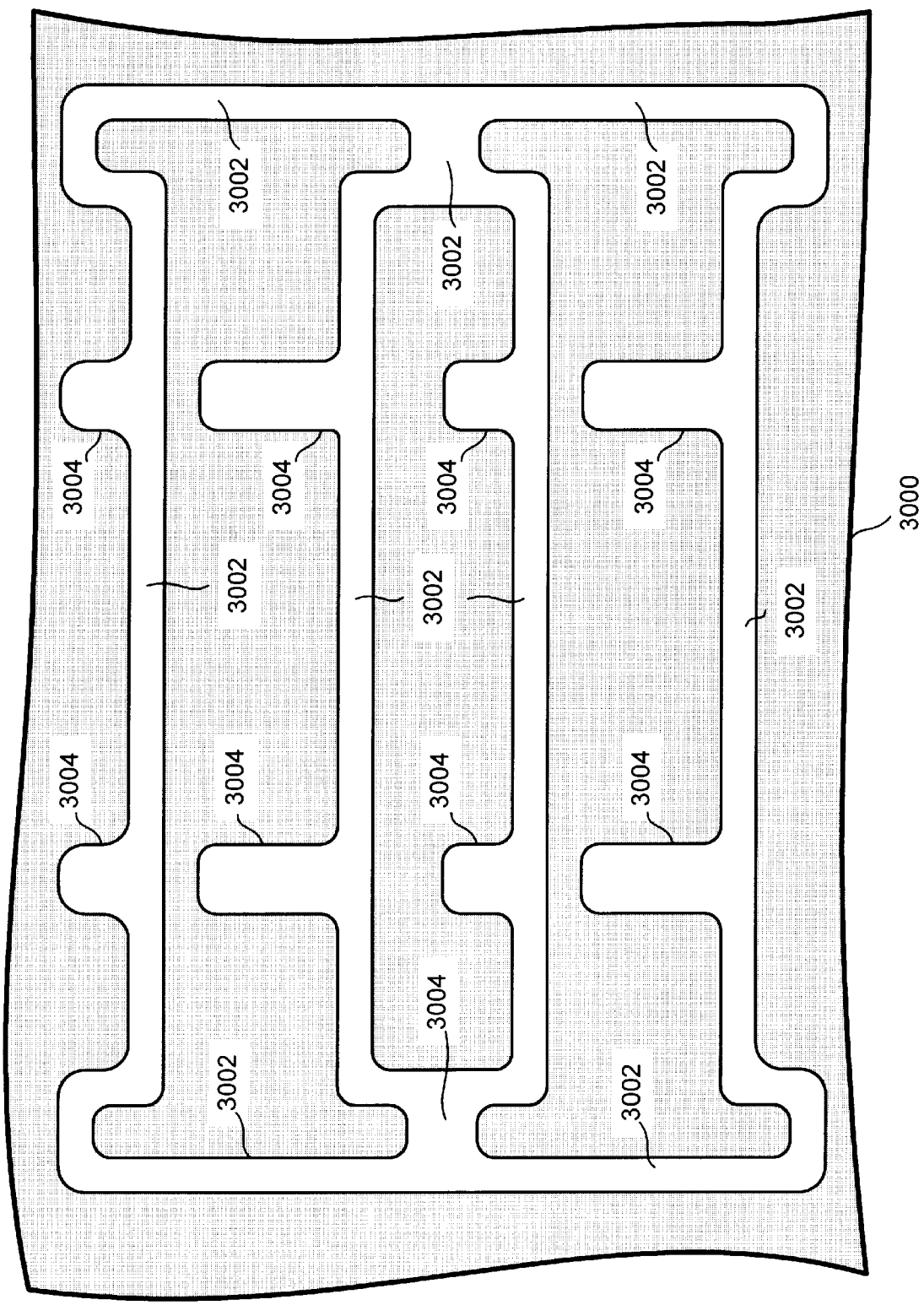
FIGS. 30 and 32 are schematic views of a third wafer portion in accordance with a preferred embodiment.

Turning to FIG. 30, a wafer portion 3000 is illustrated upon which hybrid resist has been deposited, exposed through mask portion 2900, and developed. The development causes those areas of hybrid resist which were exposed to intermediate amounts of radiation to be developed away, forming hybrid spaces in the hybrid resist. In particular, diffraction effects at the edges of mask shapes 2902 and 2904 cause corresponding areas of hybrid resist to receive an intermediate amount of radiation. After development, this causes edge-spaces 3002 to be formed in the hybrid resist. Likewise, diffraction effects at the sub-critical dimension shapes causes areas of hybrid resist corresponding to those shapes to be exposed to intermediate amounts of radiation. After development this causes spaces 3004 to be formed in the hybrid resist.

The width of spaces 3002 are determined by the amount of diffraction at the edges of the blocking mask shapes and the exposure response profile of the hybrid resist. The width of spaces 3004 are determined by the diffraction effects caused by the sub-critical dimension mask shapes. Because the sub-critical dimension mask shapes have a dimension which is too small to be resolved by the exposure tool an intermediate exposure occurs under the entire region corresponding to the sub-critical dimension mask shape. This causes a wider region of hybrid resist to be exposed to intermediate exposure, and hence a wider space is formed in the hybrid resist. In the context of the SRAM gate conductor, this allows relatively wide contact pads to be formed with the same process that forms relatively narrow gate conductors.

Figure 31:
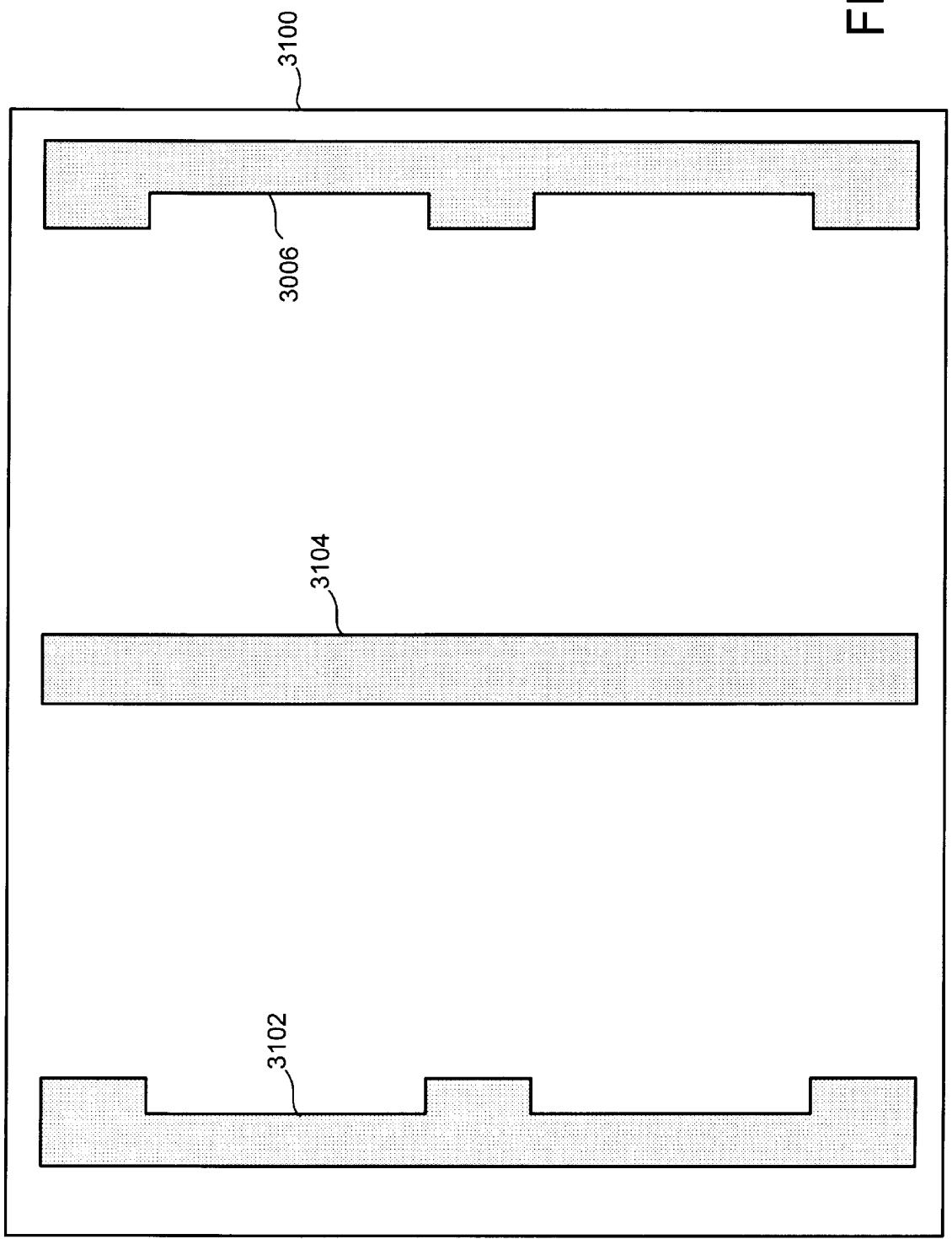
FIG. 31 is a schematic view of a trim mask portion.

After development, the next step is to memorize the pattern into the underlying hard mask with a suitable etch selective to the remaining hybrid resist. The remaining hybrid resist is then stripped and the gate conductor pattern is trimmed using a trim mask. Turning to FIG. 31, a trim mask portion 3100 is shown which can be used to trim the gate conductor pattern formed by the hybrid resist. The trim mask portion 3100 includes the trim mask shapes 3102, 3104 and 3106. To trim the pattern using trim mask portion 3100 a suitable resist (preferably a postive tone, although a negative tone could be used with a different trim mask) is deposited on the remaining hard mask. The resist is then exposed through mask portion 3100 and developed. The underlying substrate is then etched selective to the remaining resist and the remaining hard mask. This creates a pattern in the underlying substrate which is the intersection of the two patterns.

Figure 32:
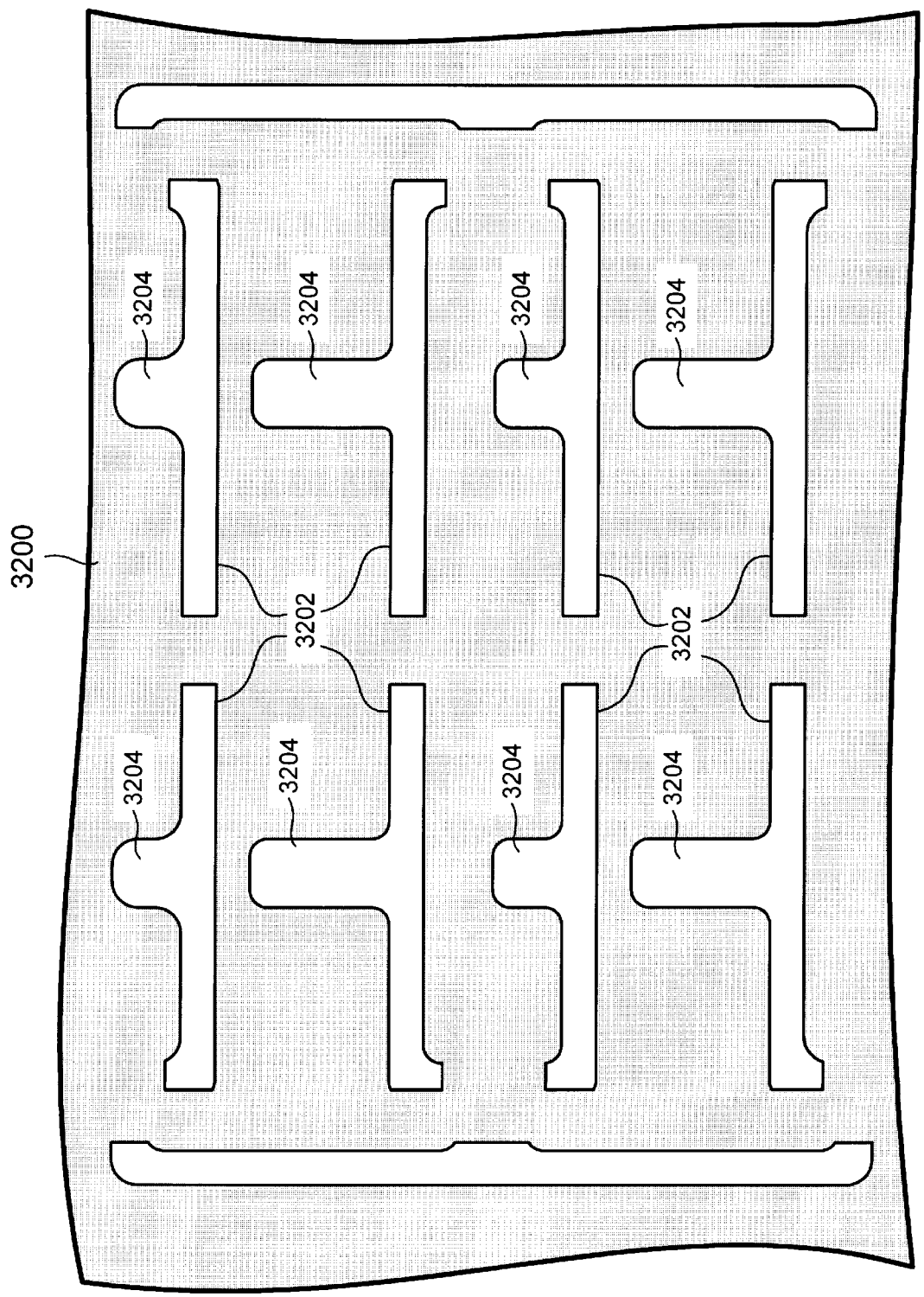

Turning to FIG. 32, the wafer portion 3200 is illustrated after the substrate has been patterned as described. The wafer portion 3200 includes a plurality of gate conductor patterns, with each gate conductor having a minimum dimension portion 3202 as provided by a hybrid resist, and a relatively wider contact tab as defined by the sub-critical dimension mask shapes.

Figure 33:
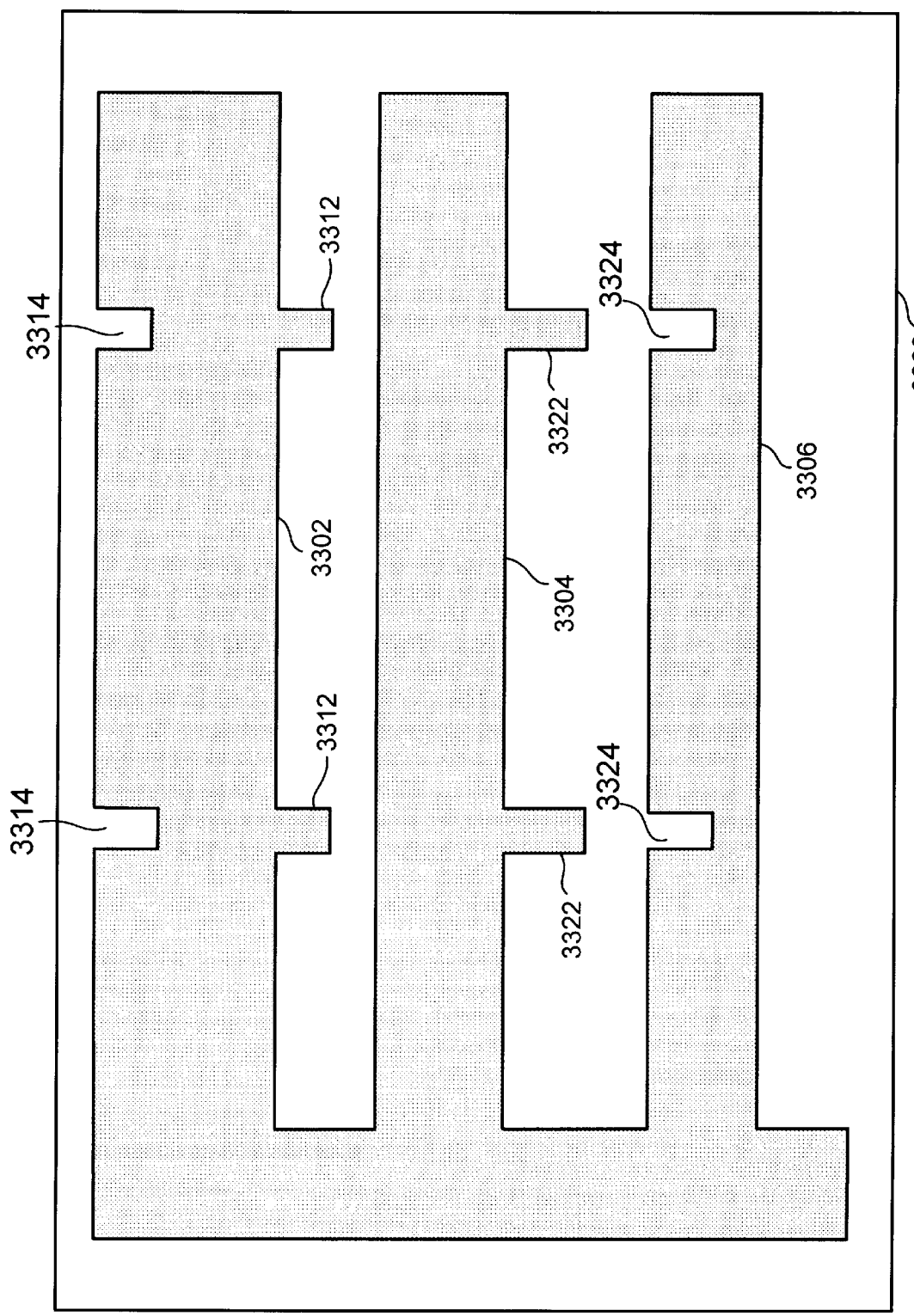
FIG. 33 is a schematic view of a fourth mask portion in accordance with a preferred embodiment.

After forming the gate conductors in a SRAM device as described, the preferred method can be used to form the local level interconnects using a similar process. Again, a suitable hard mask (e.g. silicon dioxide or silicon nitride) is deposited on the wafer portion. Hybrid resist is then deposited on the hard mask, exposed and developed. Turning to FIG. 33, a mask portion 3300 which is exemplary of a mask which can be used at this step to form local level interconnects in a SRAM device. The mask portion 3300 includes three shapes 3302, 3304 and 3306. All three shapes include a plurality of sub-critical dimension portions in accordance with the preferred method. In particular, mask shapes 3302 includes sub-critical dimension protrusions 3312 and sub-critical dimension gaps 3314. Likewise, mask shape 3304 includes sub-critical dimension protrusions 3322 and mask shape 3306 includes sub-critical dimension gaps 3324. All of the sub-critical dimension shapes 3314, 3312, 3322 and 3324 have at least one dimension which is smaller than can be accurately patterned using the exposure tool. Again, when hybrid resist is deposited and exposed through mask portion 3300 diffraction effects around the sub-critical dimension shapes causes areas of hybrid resist corresponding to those shapes to be exposed to intermediate amounts of radiation.

Figure 34:
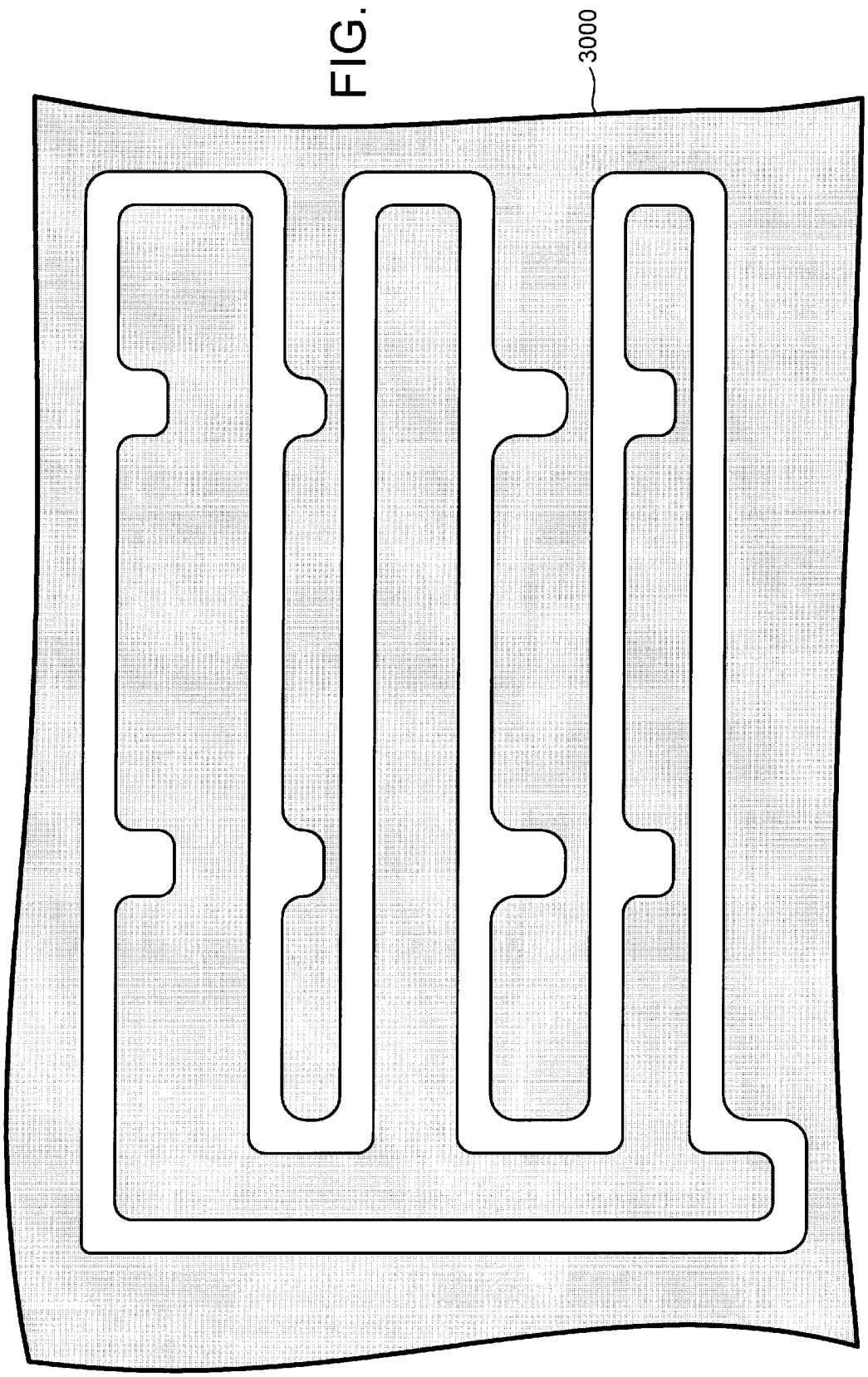
FIGS. 34 and 36 are schematic views of a fourth wafer portion in accordance with a preferred embodiment.

Turning to FIG. 34, the wafer portion 3000 is illustrated upon which hybrid resist has been deposited, exposed through mask portion 3300, and developed. The development causes those areas of hybrid resist which were exposed to intermediate amounts of radiation to be developed away, forming hybrid spaces in the hybrid resist. Again, because the sub-critical dimension mask shapes have a dimension which is too small to be resolved by the exposure tool, an intermediate exposure occurs under the entire region corresponding to the sub-critical dimension mask shape. This causes a wider region of hybrid resist to be exposed to intermediate exposure, and hence a wider space is formed in the hybrid resist. In the context of the SRAM local level interconnect, this allows relatively wide contact pads to be formed with the same process.

Figure 35:
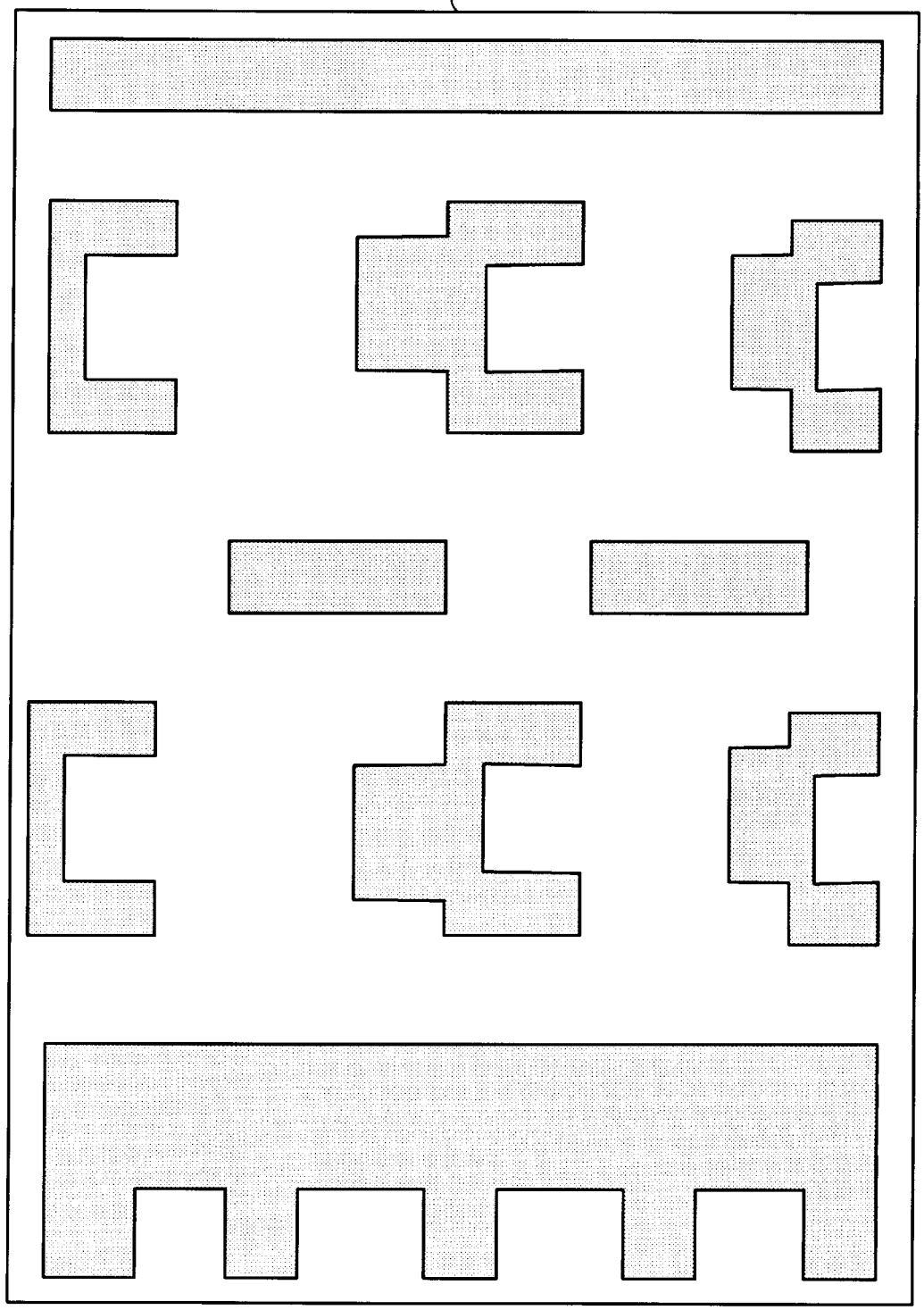
FIG. 35 is a schematic view of a trim mask portion.

After development, the pattern is memorized into the underlying hard mask with a suitable etch selective to the remaining hybrid resist. The remaining hybrid resist is then stripped and the local level interconnect pattern is trimmed using a trim mask. Turning to FIG. 35, a trim mask portion 3500 is shown which can be used to trim the local level interconnect pattern formed by the hybrid resist. To trim the pattern using trim mask portion 3500 a suitable resist is deposited on the remaining hard mask. The resist is then exposed through mask portion 3500 and developed. The underlying substrate is then etched selective to the remaining resist and the remaining hard mask. Again this creates a pattern in the underlying substrate which is the intersection of the two patterns.

Figure 36:
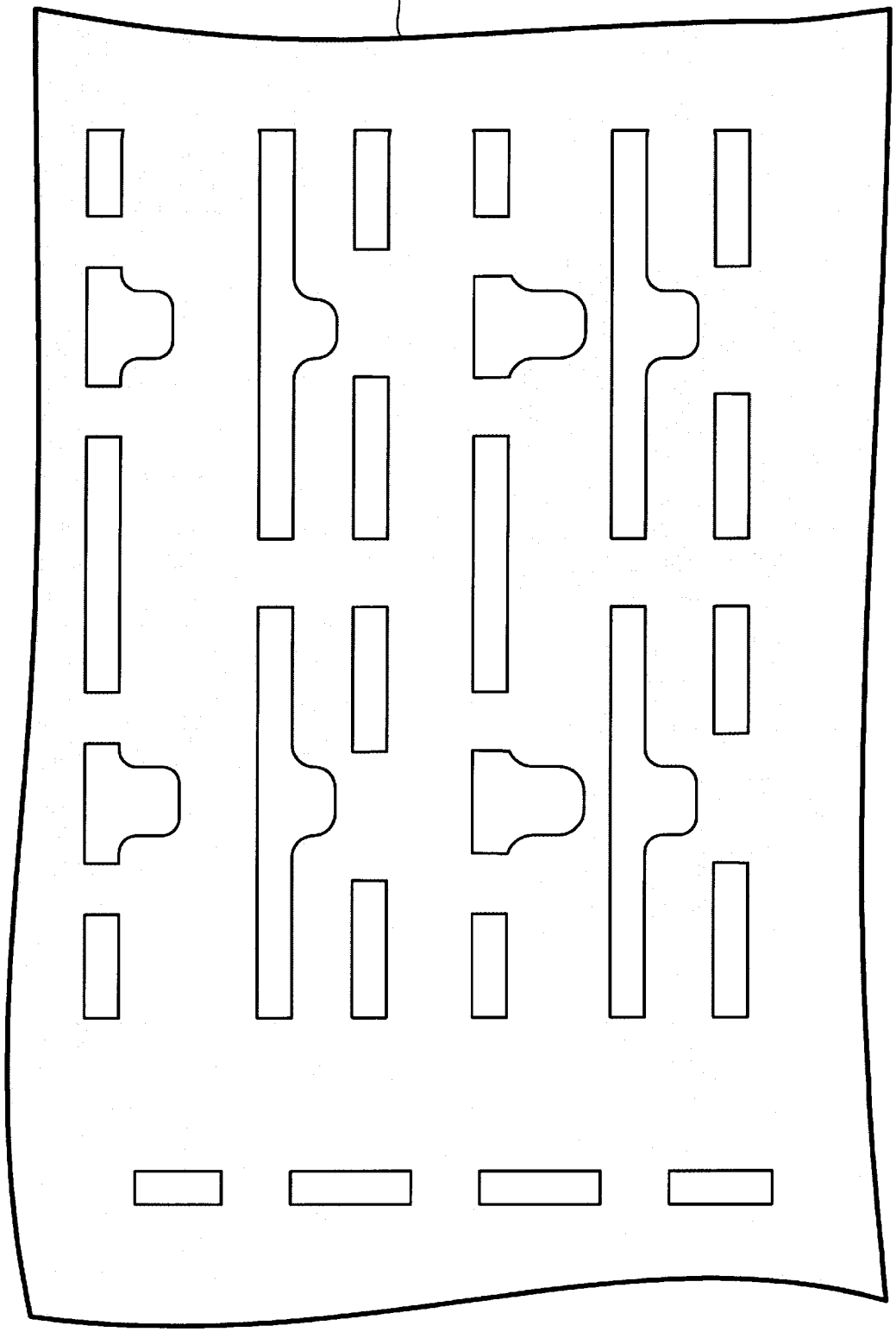

Turning to FIG. 36, the wafer portion 3000 is illustrated after the substrate has been patterned as described. The wafer portion 3000 includes a plurality of local level interconnect patterns, with some portions of the local level interconnects having a minimum dimension portion as provided by a hybrid resist, and other portions having a relatively wider region as defined by the sub-critical dimension mask shapes. These relatively wider regions are preferably formed to line up and contact with the contact tabs in the gate conductor level. The relatively wider width of the regions improves the connection between levels and minimizes the problems associated with alignment errors.

Thus, the preferred embodiments capitalize on the unique properties of hybrid resist to form spaces of different widths using sub-critical dimension mask shapes. The application of the preferred method has been described with reference to the formation of STI regions in DRAM devices, and in the formation of gate conductors and local level interconnects in SRAM devices.

While the invention has been particularly shown and described with reference to an exemplary embodiment using hybrid resist to form these particular devices, those skilled in the art will recognize that the preferred embodiment can be applied to other applications as well, and that various changes in form and details may be made therein without departing from the spirit and scope of the invention. For example, it will also be understood by those skilled in the art that the invention is applicable to different isolation technologies (e.g., LOCOS, recessed oxide (ROX), etc.), well and substrate technologies, dopant types, energies and species. It will also be understood that the spirit of the invention is applicable to other semiconductor technologies (e.g., BiCMOS, bipolar, silicon on insulator (SOI), silicon germanium (SiGe).

What is claimed is:

1. A method for forming features on a substrate, the method comprising the steps of:

a) depositing a layer of hybrid resist on said substrate;

b) exposing said hybrid resist layer in an exposure system through a mask containing at least one sub-critical dimension mask shape such that a first portion of said hybrid resist corresponding to said at least one sub-critical dimension shape is exposed to an intermediate exposure level;

c) developing said hybrid resist layer such that said first portion of said hybrid resist is removed.

2. The method of claim 1 wherein said mask is an Nx reduction mask, where N is the amount of reduction, and wherein said sub-critical dimension shape has at least one dimension less than N times the maximum resolution of said exposure system, where the maximum resolution is defined to correspond to a Rayleigh k factor of 0.55 or less.

3. The method of claim 1 wherein said at least one sub-critical dimension mask shape comprises a sub-critical dimension protrusion extending from a larger mask shape.

4. The method of claim 1 wherein said at least one sub-critical dimension mask shape comprises a sub-critical dimension gap extending into a larger mask shape.

5. The method of claim 1 wherein said at least one sub-critical dimension mask shape comprises a gap between two mask shapes.

6. The method of claim 1 wherein said at least one sub-critical dimension mask shape comprises a plurality of sub-critical dimension shapes arranged together such that a region of said hybrid resist corresponding to said plurality of features receives an intermediate exposure.

7. A method for forming a feature on a semiconductor substrate, the method comprising the steps of:

a) depositing a layer of hybrid resist on said semiconductor substrate;

b) exposing said hybrid resist layer through a mask containing at least one mask shape, said mask shape including edges and at least one sub-critical dimension portion such that first portions of said hybrid resist corresponding to said mask shape edges and said at least one sub-critical dimension portion are exposed to intermediate exposure and become soluble in developer, and wherein second portions of said hybrid resist receive substantially no exposure and remain photoactive, and wherein third portions are fully exposed and become insoluble in developer;

c) developing said hybrid resist layer such that said first portions of said hybrid resist are removed, said developing forming a patterned hybrid resist; and d) forming a feature with said patterned hybrid resist.

8. The method of claim 7 wherein said mask comprises an Nx reduction mask, where N is the amount of reduction and wherein said sub-critical dimension portion shape has at least one dimension less than N times the minimum feature dimension which can be accurately patterned by said exposure system, this exposure system limit being defined as corresponding to a Rayleigh k factor of 0.55 or less.

9. The method of claim 7 wherein said at least one sub-critical dimension portion comprises a sub-critical dimension protrusion extending from a larger mask shape.

10. The method of claim 7 wherein said at least one sub-critical dimension portion comprises a sub-critical dimension gap extending into a larger mask shape.

11. The method of claim 7 wherein said at least one sub-critical dimension portion comprises a gap between two mask shapes.

12. The method of claim 7 wherein said at least one sub-critical dimension portion comprises a plurality of sub-critical dimension shapes arranged together such that a region of said hybrid resist corresponding to said plurality of features receives an intermediate exposure.

13. The method of claim 7 wherein the step of forming a feature with said patterned hybrid resist comprises forming shallow trench isolation with said patterned hybrid resist.

14. The method of claim 13 wherein said shallow trench isolation includes a relatively wide isolation area corresponding to said at least one sub-critical dimension portion and relatively narrow isolation areas corresponding to said edges of said mask shape portion.

15. The method of claim 14 wherein said shallow trench isolation is part of a DRAM device.

16. The method of claim 7 wherein the step of forming a feature with said patterned hybrid resist comprises forming a gate conductor with said patterned hybrid resist.

17. The method of claim 16 wherein said gate conductor is part of a SRAM device.

18. The method of claim 16 wherein said gate conductor includes a contact area corresponding to said at least one sub-critical dimension portion and gate conductor areas corresponding to said edges of said mask shape, wherein the contact area is relatively wide compared to the gate conductor area.

19. The method of claim 7 wherein the step of forming a feature with said patterned hybrid resist comprises forming a local level interconnect with said patterned hybrid resist.

20. The method of claim 19 wherein said local level interconnect is part of a SRAM device.

21. The method of claim 20 wherein said local level interconnect includes a contact area corresponding to said at least one sub-critical dimension shape portion and local level interconnect areas corresponding to said edges of said mask shape, wherein the contact area is relatively wide compared to the local level interconnect area.

* * * * *